(12) United States Patent
Ohta et al.

(10) Patent No.: US 12,120,483 B2
(45) Date of Patent: Oct. 15, 2024

(54) AUDIO DEVICE

(71) Applicant: TDK CORPORATION, Tokyo (JP)

(72) Inventors: Yoshiki Ohta, Tokyo (JP); Takuto Horii, Tokyo (JP); Yoshikazu Shimura, Tokyo (JP); Atsushi Ezawa, Tokyo (JP); Miho Bamba, Tokyo (JP); Kaoru Kijima, Tokyo (JP); Akihiro Takeda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 610 days.

(21) Appl. No.: 17/424,257

(22) PCT Filed: Jan. 20, 2020

(86) PCT No.: PCT/JP2020/001689
§ 371 (c)(1),
(2) Date: Jul. 20, 2021

(87) PCT Pub. No.: WO2020/153290
PCT Pub. Date: Jul. 30, 2020

(65) Prior Publication Data
US 2022/0070575 A1 Mar. 3, 2022

(30) Foreign Application Priority Data

Jan. 21, 2019 (JP) ................. 2019-007977

(51) Int. Cl.
*H01L 41/047* (2006.01)
*H04R 1/24* (2006.01)
(Continued)

(52) U.S. Cl.
CPC ................. *H04R 1/24* (2013.01); *H04R 7/04* (2013.01); *H04R 17/00* (2013.01);
(Continued)

(58) Field of Classification Search
CPC .. H10N 30/2047; H10N 30/50; H10N 30/874; H10N 30/875
See application file for complete search history.

(56) References Cited

U.S. PATENT DOCUMENTS

| 4,742,264 A | 5/1988 | Ogawa | |
| 5,796,854 A * | 8/1998 | Markow | ............... G06F 1/1688 |
| | | | 381/89 |

(Continued)

FOREIGN PATENT DOCUMENTS

| JP | S54-107726 A | 8/1979 |
| JP | S61-205100 A | 9/1986 |

(Continued)

OTHER PUBLICATIONS

Jun. 16, 2021 International Preliminary Report on Patentability issued in International Patent Application No. PCT/JP2020/001689.
(Continued)

*Primary Examiner* — Bryan P Gordon
(74) *Attorney, Agent, or Firm* — Oliff PLC

(57) ABSTRACT

An audio device includes a vibration member, and a first piezoelectric vibrator and a second piezoelectric vibrator that are provided on the vibration member. A natural frequency of the first piezoelectric vibrator is larger than a natural frequency of the second piezoelectric vibrator.

19 Claims, 18 Drawing Sheets

(51) Int. Cl.
*H04R 7/04* (2006.01)
*H04R 17/00* (2006.01)
*H10N 30/20* (2023.01)
*H10N 30/50* (2023.01)
*H10N 30/87* (2023.01)

(52) U.S. Cl.
CPC ......... *H10N 30/2047* (2023.02); *H10N 30/50* (2023.02); *H10N 30/874* (2023.02); *H10N 30/875* (2023.02)

(56) References Cited

U.S. PATENT DOCUMENTS

| | | | | |
|---|---|---|---|---|
| 2015/0326976 | A1* | 11/2015 | Kushima | H04R 7/045 381/191 |
| 2016/0105740 | A1* | 4/2016 | Suzuki | H04R 1/26 381/333 |
| 2020/0314556 | A1* | 10/2020 | Lee | H04R 17/005 |
| 2022/0070575 | A1* | 3/2022 | Ohta | H10N 30/875 |

FOREIGN PATENT DOCUMENTS

| | | |
|---|---|---|
| JP | 2015-177422 A | 10/2015 |
| JP | 6010525 B2 | 10/2016 |
| KR | 10-2019-0000462 A | 1/2019 |
| WO | 2010/106736 A1 | 9/2010 |
| WO | 2014/024736 A1 | 2/2014 |
| WO | 2014/184994 A1 | 11/2014 |

OTHER PUBLICATIONS

Mar. 17, 2020 Search Report issued in International Patent Application No. PCT/JP2020/001689.

* cited by examiner

Fig.2
(a)
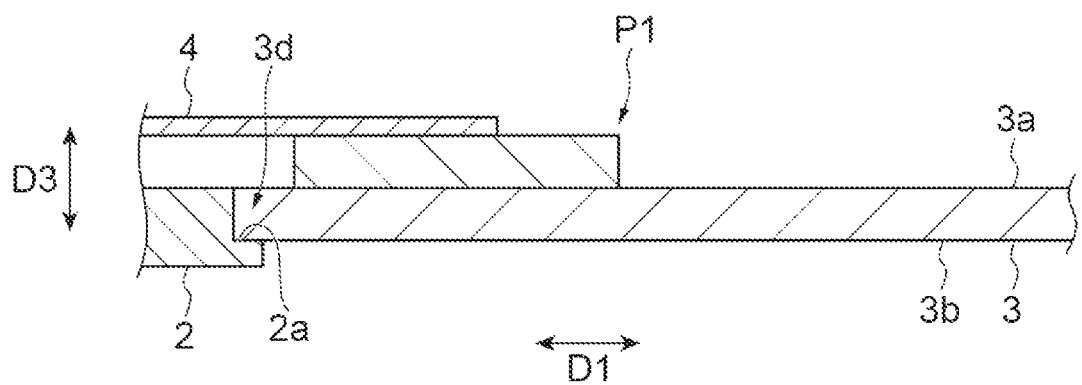
(b)
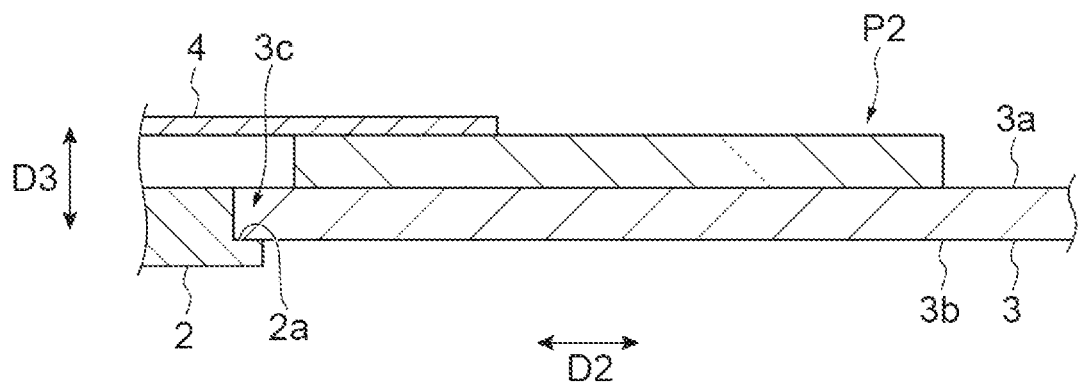

AUDIO DEVICE

TECHNICAL FIELD

One aspect of the present invention relates to an audio device.

BACKGROUND ART

Patent Literature 1 discloses a piezoelectric speaker including a support having flexibility and a piezoelectric element disposed on the support. According to this piezoelectric speaker, downsizing can be achieved as compared with an electromagnetic speaker using an electromagnet.

CITATION LIST

Patent Literature

Patent Literature 1: Japanese Patent No. 6010525

SUMMARY OF INVENTION

Technical Problem

The piezoelectric speaker described above has a narrower sound range than that of an electromagnetic speaker.

One aspect of the present invention provides an audio device capable of improving sound quality in a wide range while achieving downsizing.

Solution to Problem

An audio device according to one aspect of the present invention includes a vibration member, and a first piezoelectric vibrator and a second piezoelectric vibrator provided on the vibration member. A natural frequency of the first piezoelectric vibrator is larger than a natural frequency of the second piezoelectric vibrator.

In this audio device, the natural frequency of the first piezoelectric vibrator is larger than the natural frequency of the second piezoelectric vibrator. Thus, the first piezoelectric vibrator can improve sound quality in a high range as compared with the second piezoelectric vibrator. The second piezoelectric vibrator can improve sound quality in a low range as compared with the first piezoelectric vibrator. Accordingly, it is possible to improve sound quality in a wide range while downsizing is achieved.

In the above one aspect, a maximum length of the first piezoelectric vibrator may be shorter than a maximum length of the second piezoelectric vibrator when viewed from a direction orthogonal to a main face of the vibration member. In this case, it is possible to easily implement the first piezoelectric vibrator having a larger natural frequency than the natural frequency of the second piezoelectric vibrator.

In the above one aspect, the first piezoelectric vibrator and the second piezoelectric vibrator may be synchronously driven by a same drive signal. In this case, as compared with a case where the first piezoelectric vibrator and the second piezoelectric vibrator are driven by different drive signals, it is possible to improve sound quality in a wide range while a configuration of a control circuit is prevented from being complicated.

In the above one aspect, a distance between the first piezoelectric vibrator and the second piezoelectric vibrator may be longer than a maximum length of the second piezoelectric vibrator when viewed from a direction orthogonal to a main face of the vibration member. In this case, it is possible for the sound of the first piezoelectric vibrator and the sound of the second piezoelectric vibrator to be independent sounds.

In the above one aspect, a distance between the first piezoelectric vibrator and the second piezoelectric vibrator may be shorter than a maximum length of the second piezoelectric vibrator when viewed from a direction orthogonal to a main face of the vibration member. In this case, the connection between the sound of the first piezoelectric vibrator and the sound of the second piezoelectric vibrator is improved.

The above one aspect may further include a restraint member restraining the vibration member, in which a distance between the first piezoelectric vibrator and the restraint member may be longer than a distance between the second piezoelectric vibrator and the restraint member when viewed from the direction orthogonal to the main face of the vibration member. In this case, the first piezoelectric vibrator has a relatively long distance to the restraint member and can further improve sound quality in a high range. The second piezoelectric vibrator has a relatively short distance to the restraint member and can further improve sound quality in a low range. Accordingly, it is possible to further improve sound quality in a wide range.

In the above one aspect, a distance between the first piezoelectric vibrator and a gravity center of a main face of the vibration member may be shorter than a distance between the second piezoelectric vibrator and the gravity center when viewed from a direction orthogonal to the main face. In this case, the first piezoelectric vibrator can reliably improve sound quality in a high range. Accordingly, it is possible to reliably improve sound quality in a wide range.

Advantageous Effects of Invention

According to one aspect of the present invention, there is provided an audio device capable of improving sound quality in a wide range while downsizing is achieved.

BRIEF DESCRIPTION OF DRAWINGS

FIG. 2 is a cross-sectional view of the audio device in FIG. 1.

DESCRIPTION OF EMBODIMENTS

Hereinafter, embodiments will be described in detail with reference to the accompanying drawings. Note that, the same reference signs are assigned to the same elements or elements having the same function in the description, and the redundant description will be omitted.

First Embodiment

Figure 1:
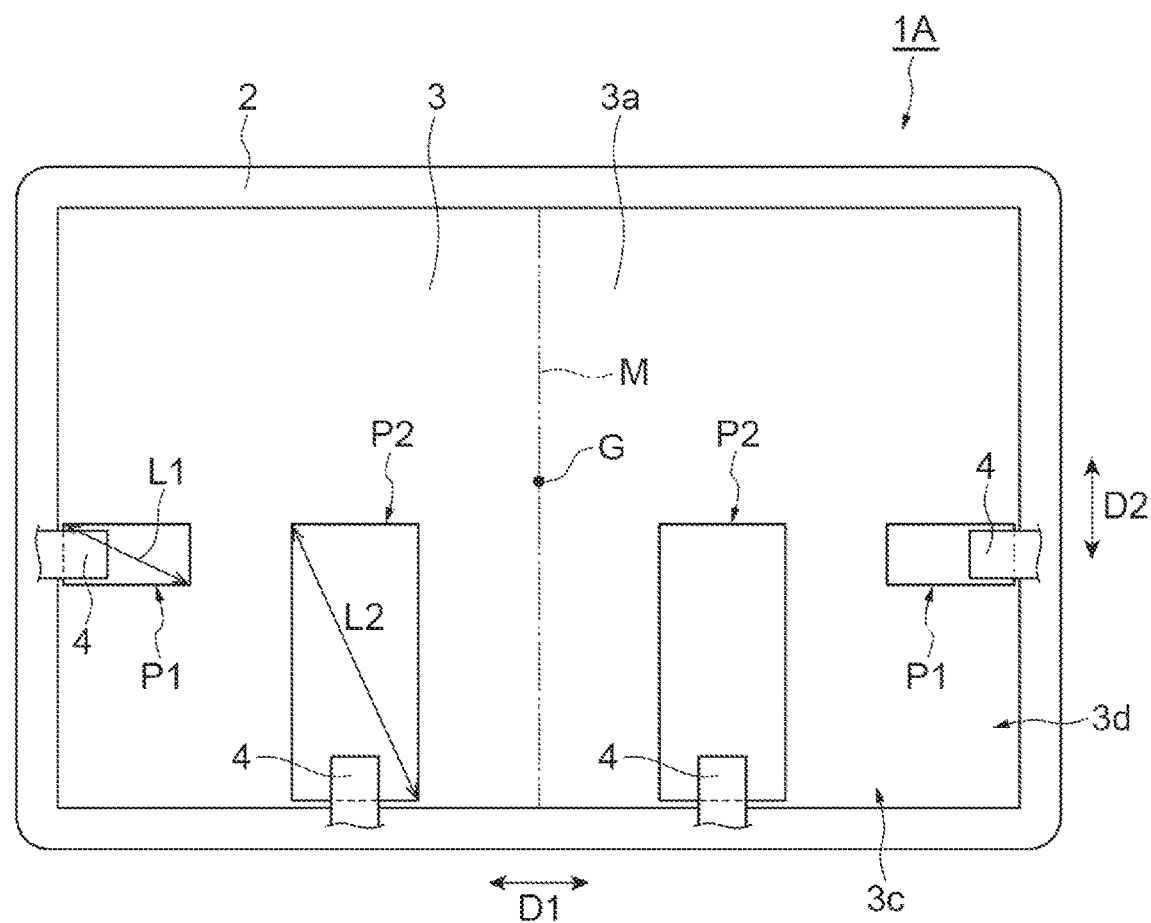
FIG. 1 is a plan view of an audio device according to a first embodiment.

FIG. 1 is a plan view of an audio device according to a first embodiment. FIG. 2 is a cross-sectional view of the audio device in FIG. 1. As shown in FIGS. 1 and 2, an audio device 1A according to the first embodiment includes a restraint member 2, a vibration member 3, a pair of piezoelectric vibrators P1, and a pair of piezoelectric vibrators P2. Each piezoelectric vibrator P1 and each piezoelectric vibrators P2 have different natural frequencies from each other. The natural frequency varies depending on the shape, material, density, structure, stress, and the like of each of the piezoelectric vibrators P1 and the piezoelectric vibrators P2. The density varies depending on not only the material but also the manufacturing method. The audio device 1A generates sound by, for example, vibrating the vibration member 3 with the pair of piezoelectric vibrators P1 and the pair of piezoelectric vibrators P2. The audio device 1A is used as, for example, a speaker or a buzzer.

The restraint member 2 is, for example, a frame body having a rectangular shape and restrains an outer edge portion of the vibration member 3. The restraint member 2 restrains the entire circumference of the outer edge portion. A step portion 2a to which the outer edge portion is joined is formed at an inner edge portion of the restraint member 2. The rectangular shape includes, for example, a rectangular shape in which each corner is chamfered and a rectangular shape in which each corner is rounded.

The vibration member 3 is, for example, a plate member having a rectangular shape. The vibration member 3 has flexibility. The vibration member 3 is made of, for example, resin, glass, or metal. The vibration member 3 has a pair of main faces 3a and 3b opposing each other. Each of the main faces 3a and 3b has a rectangular shape having a pair of long sides and a pair of short sides. The outer edge portion of the main face 3b is joined to the step portion 2a of the restraint member 2. The outer edge portion of the main face 3b is restrained while being supported by the step portion 2a. The outer edge portion of the vibration member 3 has a pair of long side portions 3c including the long sides of each of the main faces 3a and 3b and a pair of short side portions 3d including the short sides of each of the main faces 3a and 3b.

In the following, the long-side direction of each of the main faces 3a and 3b is referred to as a first direction D1, the short-side direction is referred to as a second direction D2, and the opposing direction is referred to as a third direction D3. The third direction D3 is also a direction orthogonal to each of the main faces 3a and 3b. The length of the vibration member 3 (the length of the vibration member 3 in the first direction D1) is, for example, 240 mm. The width of the vibration member 3 (the length of the vibration member 3 in the second direction D2) is, for example, 160 mm. The thickness of the vibration member 3 (the length of the vibration member 3 in the third direction D3) is, for example, 1.05 mm.

Figure 3:
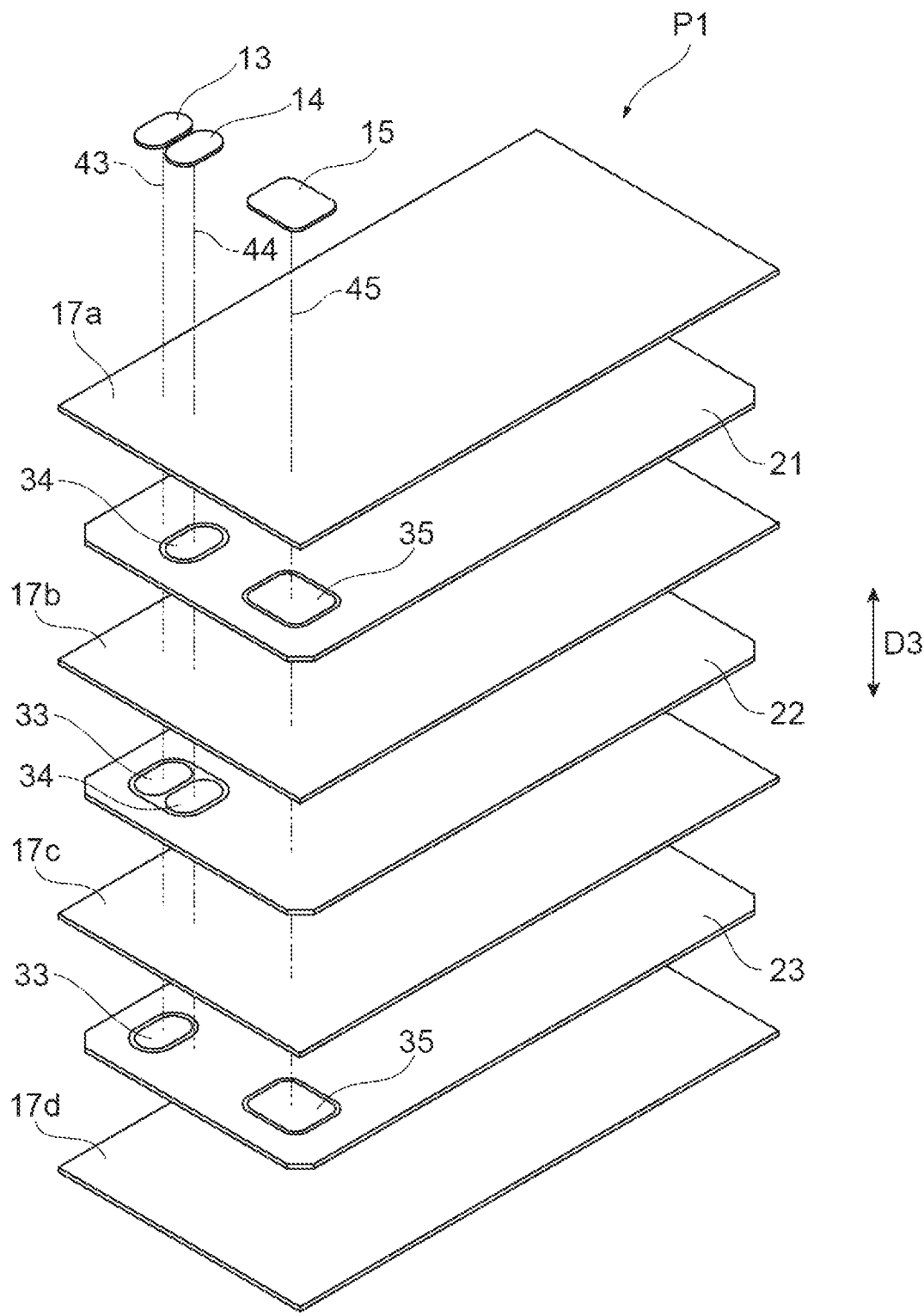
FIG. 3 is an exploded perspective view of a piezoelectric vibrator in FIG. 1.
Figure 4:
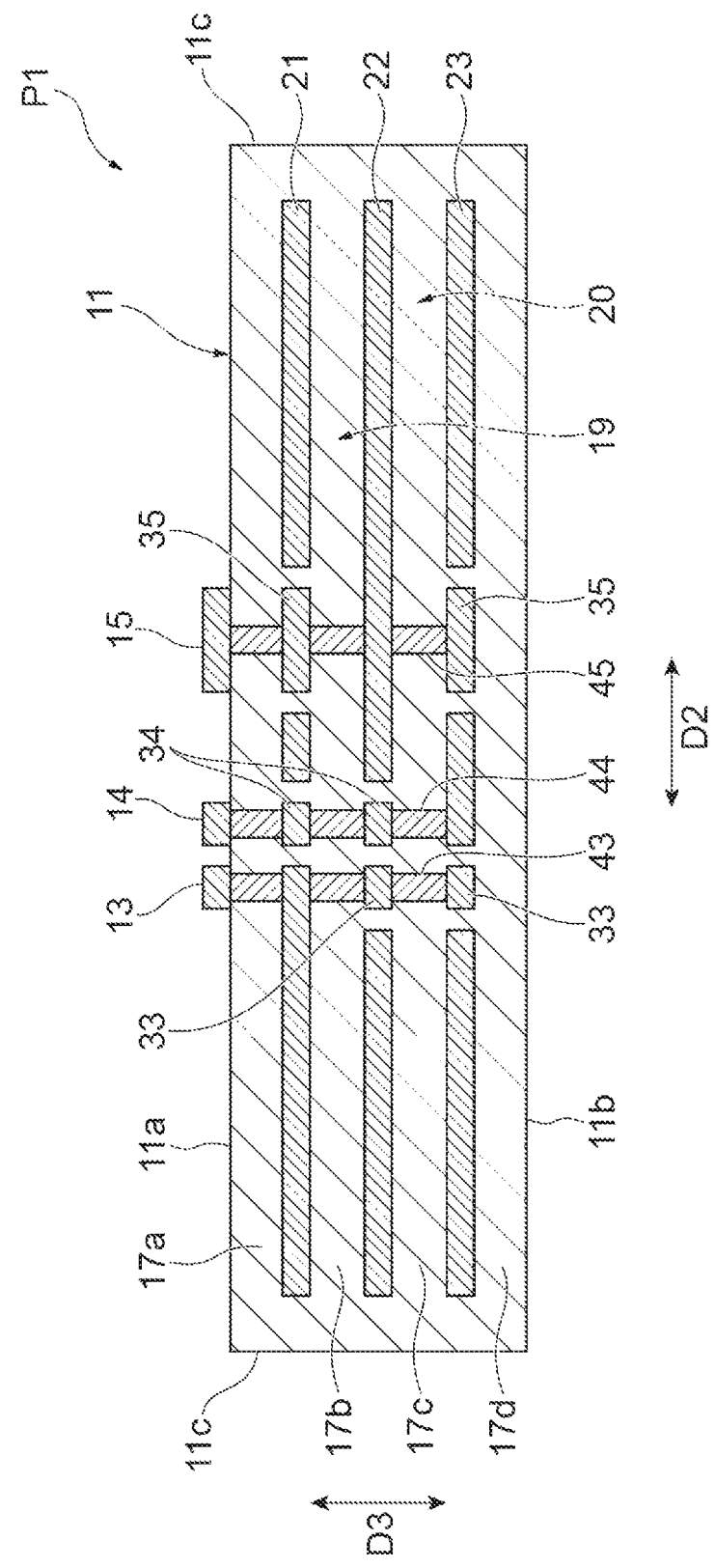
FIG. 4 is a cross-sectional view of the piezoelectric vibrator in FIG. 1.

FIG. 3 is an exploded perspective view of each piezoelectric vibrator P1 in FIG. 1. FIG. 4 is a cross-sectional view of each piezoelectric vibrator P1 in FIG. 1. As shown in FIGS. 3 and 4, each piezoelectric vibrator P1 includes a piezoelectric element body 11 and a plurality of (in this specification, three) external electrodes 13, 14, and 15. Each piezoelectric vibrator P1 is, for example, a bimorph piezoelectric element.

The piezoelectric element body 11 has a rectangular parallelepiped shape. The rectangular parallelepiped shape includes, for examples, a rectangular parallelepiped shape in which the corner portions and the ridge portions are chamfered and a rectangular parallelepiped shape in which the corner portions and the ridge portions are rounded. The piezoelectric element body 11 has a pair of main faces 11a and 11b opposing each other and four side faces 11c connecting the main faces 11a and 11b to each other. The direction in which the main faces 11a and 11b face each other is aligned with the third direction D3.

Each of the main faces 11a and 11b has a rectangular shape having a pair of long sides and a pair of short sides. That is, each piezoelectric vibrator P1 (piezoelectric element body 11) has a rectangular shape having a pair of long sides and a pair of short sides in plan view. The length of the piezoelectric element body 11 (the length of the piezoelectric element body 11 in the long-side direction of the main face 11a) is, for example, 30 mm. The width of the piezoelectric element body 11 (the length of the piezoelectric element body 11 in the short-side direction of the main face 11a) is, for example, 15 mm. The thickness of the piezoelectric element body 11 (the length of the piezoelectric element body 11 in the third direction D3) is, for example, 0.7 mm.

The piezoelectric element body 11 includes a plurality of piezoelectric layers 17a, 17b, 17c, and 17d. The plurality of piezoelectric layers 17a, 17b, 17c, and 17d are laminated in this order. The laminating direction of the plurality of piezoelectric layers 17a, 17b, 17c, and 17d is aligned with the third direction D3. The piezoelectric layer 17a has the main face 11a. The piezoelectric layer 17d has the main face 11b. The piezoelectric layers 17b and 17c are positioned between the piezoelectric layer 17a and the piezoelectric layer 17d. In the present embodiment, the piezoelectric layers 17a, 17b, 17c, and 17d have an equal thickness. The term "equal" includes a manufacturing error range.

Each of the piezoelectric layers 17a, 17b, 17c, and 17d is made of a piezoelectric material. In the present embodiment, each of the piezoelectric layers 17a, 17b, 17c, and 17d is made of a piezoelectric ceramic material. As the piezoelectric ceramic material, PZT [Pb(Zr, Ti)O$_3$], PT (PbTiO$_3$), PLZT [(Pb, La)(Zr, Ti)O$_3$], or barium titanate (BaTiO$_3$) is used, for example. Each of the piezoelectric layers 17a, 17b, 17c, and 17d is made of, for example, a sintered body of a ceramic green sheet containing the above piezoelectric ceramic material. In the actual piezoelectric element body 11, the piezoelectric layers 17a, 17b, 17c, and 17d are integrated in such a way that boundaries between the piezoelectric layers 17a, 17b, 17c, and 17d cannot be visually recognized.

Each of the external electrodes 13, 14, and 15 is disposed on the main face 11a. The external electrodes 13, 14, and 15 are arranged on one short side of the main face 11a in the order of the external electrode 13, the external electrode 14, and the external electrode 15 along the one short side. The external electrode 13 and the external electrode 14 are adjacent to each other in the short-side direction of the main face 11a. The external electrode 14 and the external electrode 15 are adjacent to each other in the short-side direction of the main face 3a. In the short-side direction of the main face 11a, the distance (shortest distance) between the external electrode 14 and the external electrode 15 is longer than the distance (shortest distance) between the external electrode 13 and the external electrode 14. Each of the external electrodes 13, 14, and 15 is separated from all the edges (four sides) of the main face 11a when viewed from the third direction D3.

Each of the external electrodes 13 and 14 has a rectangular shape when viewed from the third direction D3. In the present embodiment, each corner of the rectangular shape is rounded. The external electrode 15 has a square shape when viewed from the third direction D3. The square shape includes, for example, a square shape in which each corner is chamfered and a square shape in which each corner is rounded. In the present embodiment, each corner of the square shape is rounded. Each of the external electrodes 13, 14, and 15 is made of a conductive material. As the conductive material, Ag, Pd, Pt, or an Ag—Pd alloy is used, for example. Each of the external electrodes 13, 14, and 15 is formed as, for example, a sintered body of a conductive paste containing the above conductive material.

Each piezoelectric vibrator P1 includes a plurality of internal electrodes 21, 22, and 23 disposed in the piezoelectric element body 11. Each of the internal electrodes 21, 22, and 23 is made of a conductive material. As the conductive material, Ag, Pd, Pt, or an Ag—Pd alloy is used, for example. Each of internal electrodes 21, 22, and 23 is formed as, for example, a sintered body of a conductive paste containing the above conductive material. In the present embodiment, the external shape of each of the internal electrodes 21, 22, and 23 is a rectangular shape.

The internal electrodes 21, 22, and 23 are disposed at different positions (layers) from each other in the third direction D3. The internal electrodes 21, 22, and 23 face each other with an interval in the third direction D3. The internal electrodes 21, 22, and 23 are not exposed on the surface of the piezoelectric element body 11. That is, the internal electrodes 21, 22, and 23 are not exposed on each side face 11c. Each of the internal electrodes 21, 22, and 23 is separated from all edges (four sides) of the main faces 11a and 11b when viewed from the third direction D3.

The internal electrode 21 is positioned between the piezoelectric layer 17a and the piezoelectric layer 17b. The internal electrode 22 is positioned between the piezoelectric layer 17b and the piezoelectric layer 17c. The internal electrode 23 is positioned between the piezoelectric layer 17c and the piezoelectric layer 17d.

The external electrode 13 is electrically connected to the internal electrode 21 and a plurality of connection conductors 33 through a plurality of via conductors 43. The plurality of connection conductors 33 are positioned in the same layers as the internal electrodes 22 and 23. Specifically, each connection conductor 33 is positioned in an opening formed in each of the internal electrodes 22 and 23. Each opening is formed at a position corresponding to the external electrode 13 when viewed from the third direction D3. That is, each connection conductor 33 is surrounded by each of the internal electrodes 22 and 23 when viewed from the third direction D3. Each connection conductor 33 is separated from each of the internal electrodes 22 and 23.

Each connection conductor 33 faces the external electrode 13 in the third direction D3 and is disposed at a position overlapping the external electrode 13 when viewed from the third direction D3. Each connection conductor 33 faces the internal electrode 21 in the third direction D3 and is disposed at a position overlapping the internal electrode 21 when viewed from the third direction D3. Each of the plurality of via conductors 43 is positioned between the external electrode 13, the internal electrode 21, and the plurality of connection conductors 33 and is disposed at a position overlapping the external electrode 13 when viewed from the third direction D3. Each of the plurality of via conductors 43 passes through the corresponding piezoelectric layer 17a, 17b, or 17c in the third direction D3.

The external electrode 14 is electrically connected to the internal electrode 23 and a plurality of connection conductors 34 through a plurality of via conductors 44. The plurality of connection conductors 34 are positioned in the same layers as the internal electrodes 21 and 22. Specifically, each connection conductor 34 is positioned in an opening formed in each of the internal electrodes 21 and 22. Each opening is formed at a position corresponding to the external electrode 14 when viewed from the third direction D3. That is, each connection conductor 34 is surrounded by each of the internal electrodes 21 and 22 when viewed from the third direction D3. Each connection conductor 34 is separated from each of the internal electrodes 21 and 22. The connection conductor 33 and the connection conductor 34 positioned in the same layer as the internal electrode 22 are disposed adjacent to each other in the same opening and are separated from each other.

Each connection conductor 34 faces the external electrode 14 in the third direction D3 and is disposed at a position overlapping the external electrode 14 when viewed from the third direction D3. Each connection conductor 34 faces the internal electrode 23 in the third direction D3 and is disposed at a position overlapping the internal electrode 23 when viewed from the third direction D3. Each of the plurality of via conductors 44 is positioned between the external electrode 14, the internal electrode 23, and the plurality of connection conductors 34 and is disposed at a position overlapping the external electrode 14 when viewed from the third direction D3. Each of the plurality of via conductors 44 passes through the corresponding piezoelectric layer 17a, 17b, or 17c in the third direction D3.

The external electrode 15 is electrically connected to the internal electrode 22 and a plurality of connection conductors 35 through a plurality of via conductors 45. The plurality of connection conductors 35 are positioned in the same layers as the internal electrodes 21 and 23. Specifically, each connection conductor 35 is positioned in an opening formed in each of the internal electrodes 21 and 23. Each opening is formed at a position corresponding to the external electrode 15 when viewed from the third direction D3. That is, the entire edge of each connection conductor 35 is surrounded by each of the internal electrodes 21 and 23 when viewed from the third direction D3. Each opening is formed at a position corresponding to the external electrode 15 when viewed from the third direction D3.

Each connection conductor 35 faces the external electrode 15 in the third direction D3 and is disposed at a position overlapping the external electrode 15 when viewed from the third direction D3. Each connection conductor 35 faces the internal electrode 22 in the third direction D3 and is disposed at a position overlapping the internal electrode 22 when viewed from the third direction D3. Each of the plurality of via conductors 45 is positioned between the external electrode 15, the internal electrode 22, and the plurality of connection conductors 35 and is disposed at a position overlapping the external electrode 15 when viewed from the third direction D3. Each of the plurality of via conductors 45 passes through the corresponding piezoelectric layer 17a, 17b, or 17c in the third direction D3.

Each of the connection conductors 33 and 34 has a rectangular shape when viewed from the third direction D3. In the present embodiment, each corner of the rectangular shape is rounded. Each connection conductor 35 has a square shape when viewed from the third direction D3. In the present embodiment, each corner of the square shape is rounded.

The connection conductors 33, 34, and 35 and the via conductors 43, 44, and 45 are made of a conductive material. As the conductive material, Ag, Pd, Pt, or an Ag—Pd alloy is used, for example. The connection conductors 33, 34, and 35 and the via conductors 43, 44, and 45 are formed as, for example, sintered bodies of a conductive paste containing the above conductive material. The via conductors 43, 44, and 45 are formed by sintering the conductive paste filled in a through hole formed in a ceramic green sheet for forming the corresponding piezoelectric layers 17a, 17b, and 17c.

On the main face 11b of the piezoelectric element body 11, no conductor electrically connected to the internal electrodes 21, 22, and 23 is disposed. In the present embodiment, when the main face 11b is viewed from the third direction D3, the entire main face 11b is exposed. The main faces 11a and 11b are natural faces. The natural face is a surface constituted by surfaces of crystal grains grown by firing.

On each side face 11c of the piezoelectric element body 11, no conductor electrically connected to the internal electrodes 21, 22, and 23 is disposed either. In the present embodiment, when each side face 11c is viewed from the direction intersecting the third direction D3, the entire side face 11c is exposed. In the present embodiment, each side face 11c is also a natural face.

In the piezoelectric layer 17b, a region sandwiched between the internal electrode 21 connected to the external electrode 13 and the internal electrode 22 connected to the external electrode 15 constitutes a first active region 19 that is piezoelectrically active. In the piezoelectric layers 17c, a region sandwiched between the internal electrode 23 connected to the external electrode 14 and the internal electrode 22 connected to the external electrode 15 constitutes a second active region 20 that is piezoelectrically active. The first active region 19 and the second active region 20 are disposed between the main face 11a and the main face 11b. The second active region 20 is disposed closer to the main face 11b than the first active region 19. The first active region 19 and the second active region 20 may be constituted by a plurality of piezoelectric layers.

In the present embodiment, the first active region 19 and the second active region 20 are positioned in such a way as to surround the plurality of external electrodes 13, 14, and 15 when viewed from the third direction D3. The first active region 19 and the second active region 20 include a region positioned between the external electrode 14 and the external electrode 15 when viewed from the third direction D3 and a region outside the region in which the external electrodes 13, 14, and 15 are positioned when viewed from the third direction D3.

The first active region 19 and the second active region 20 are polarized in the same direction by, for example, applying, to the external electrode 15 and the external electrode 13, voltages having different polarities from each other while the external electrode 14 is being connected to the ground. The first active region 19 is polarized in, for example, a direction from the internal electrode 21 toward the internal electrode 22, and the second active region 20 is polarized in, for example, a direction from the internal electrode 22 toward the internal electrode 23. When each piezoelectric vibrator P1 is driven, for example, a voltage having the same polarity is applied to the external electrodes 13 and 14, and a voltage having a different polarity from that applied to the external electrodes 13 and 14 is applied to the external electrode 15. Accordingly, a voltage in the same direction (forward direction) as the polarization direction is applied to one of the first active region 19 and the second active region 20 to elongate the one, and a voltage in the opposite direction (reverse direction) to the polarization direction is applied to the other to contract the other. As a result, each piezoelectric vibrator P1 bends and vibrates.

Each piezoelectric vibrator P2 shown in FIGS. 1 and 2 is, for example, a bimorph piezoelectric element. Although not shown, each piezoelectric vibrator P2 includes, similarly to each piezoelectric vibrator P1, a piezoelectric element body 11, external electrodes 13, 14, and 15, internal electrodes 21, 22, and 23, connection conductors 33, 34, and 35, and via conductors 43, 44, and 45 as shown in FIGS. 3 and 4. Each piezoelectric vibrator P2 is different from each piezoelectric vibrator P1 mainly in the shapes of the piezoelectric element body 11 and the internal electrodes 21, 22, and 23 viewed from the third direction D3. The length and width of the piezoelectric element body 11 of each piezoelectric vibrator P2 are larger than the length and width of the piezoelectric element body 11 of each piezoelectric vibrator P1.

The length of the piezoelectric element body 11 of each piezoelectric vibrator P2 (the length of the piezoelectric element body 11 in the long-side direction of the main face 11a) is, for example, 66 mm. The width of the piezoelectric element body 11 of each piezoelectric vibrator P2 (the length of the piezoelectric element body 11 in the short-side direction of the main face 11a) is, for example, 30 mm. The thickness of the piezoelectric element body 11 of each piezoelectric vibrator P2 is equal to the thickness of the piezoelectric element body 11 of each piezoelectric vibrator P1. That is, the thickness of the piezoelectric element body 11 of each piezoelectric vibrator P2 (the length of the piezoelectric element body 11 in the third direction D3) is, for example, 0.7 mm. The internal electrodes 21, 22, and 23 of each piezoelectric vibrator P2 each have a shape matching the shape of the piezoelectric element body 11 of the piezoelectric vibrator P2. The shapes of the external electrodes 13, 14, and 15, of the connection conductors 33, 34, and 35, and of the via conductors 43, 44, and 45 and a relative positional relation between them are equal between each piezoelectric vibrator P2 and each piezoelectric vibrator P1.

When viewed from the third direction D3, a maximum length L1 of each piezoelectric vibrator P1 is shorter than a maximum length L2 of each piezoelectric vibrator P2. In the present embodiment, each of the main faces 11a and 11b of each piezoelectric vibrator P1 has a rectangular shape, and the maximum length L1 is a length of a diagonal line of each of the main faces 11a and 11b of the piezoelectric vibrator P1, and is, for example, 34 mm. Each of the main faces 11a and 11b of each piezoelectric vibrator P2 also has a rectangular shape, and the maximum length L2 is a length of a diagonal line of each of the main faces 11a and 11b of the piezoelectric vibrator P2, and is, for example, 73 mm.

The pair of piezoelectric vibrators P1 and the pair of piezoelectric vibrators P2 are provided on the vibration member 3. Each piezoelectric vibrator P1 and each piezoelectric vibrator P2 are fixed to the vibration member 3 by, for example, bonding each main face 11b to the main face 3a with a bonding member (not shown). The pair of piezoelectric vibrators P1 and the pair of piezoelectric vibrators P2 are disposed to be separated from each other.

When viewed from the third direction D3, one of the pair of piezoelectric vibrators P1 is provided in a left region of a straight line M that passes through a gravity center G of the main face 3a and is parallel to the second direction D2, and the other is provided in a right region. The pair of piezoelectric vibrators P1 is disposed in such a way as to be line-symmetric with respect to the straight line M when viewed from the third direction D3. Each piezoelectric vibrator P1 is disposed in such a way that the long-side direction of the main face 11a is aligned with the first direction D1 and that the short-side direction of the main face 11a is aligned with the second direction D2. When viewed from the third direction D3, the piezoelectric vibrators P1 are disposed to be separated from each other in the first direction D1. At least a part of each piezoelectric vibrator P1 is disposed in each short side portion 3d. Specifically, one end portion of each piezoelectric vibrator P1 in the long-side direction of the main face 11a is disposed in each short side portion 3d. Each piezoelectric vibrator P1 is disposed to be separated from the pair of long side portions 3c.

When viewed from the third direction D3, one of the pair of piezoelectric vibrators P2 is provided in the left region of the straight line M, and the other is provided in the right region. The pair of piezoelectric vibrators P2 is disposed in such a way as to be line-symmetric with respect to the straight line M when viewed from the third direction D3. Each piezoelectric vibrator P2 is disposed in such a way that the long-side direction of the main face 11a is aligned with the second direction D2 and that the short-side direction of the main face 11a is aligned with the first direction D1. When viewed from the third direction D3, the piezoelectric vibrators P2 are disposed to be separated from each other in the first direction D1. At least a part of each piezoelectric vibrator P2 is disposed in one long side portion 3c. Specifically, one end portion of each piezoelectric vibrator P2 in the long-side direction of the main face 11a is disposed in one long side portion 3c. Each piezoelectric vibrator P2 is disposed to be separated from the other long side portion 3c and the pair of short side portions 3d.

When viewed from the third direction D3, each piezoelectric vibrator P2 is disposed closer to the straight line M than each piezoelectric vibrator P1. When viewed from the third direction D3, each piezoelectric vibrator P2 is disposed closer to the gravity center G than each piezoelectric vibrator P1. When viewed from the third direction D3, the distance (shortest distance) between each piezoelectric vibrator P1 and each piezoelectric vibrator P2 is shorter than the maximum length L2 of the piezoelectric vibrator P2.

Each piezoelectric vibrator P1 and each piezoelectric vibrator P2 are each connected to a wiring member 4. The wiring member 4 is, for example, a flexible printed circuit board (FPC) or a flexible flat cable (FFC). One end portion of the wiring member 4 is disposed on the external electrodes 13, 14, and 15 and connected to the external electrodes 13, 14, and 15. The wiring member 4 has, for example, a first conductor layer (not shown) connected to the external electrodes 13 and 14 and a second conductor layer (not shown) connected to the external electrode 15. The external electrodes 13 and 14 are short-circuited by the first conductor layer.

The wiring member 4 is drawn out to the restraint member 2. The other end portion of the wiring member 4 is connected to a control circuit (not shown) that controls the audio device 1A. The control circuit includes, for example, a central processing unit (CPU), a read only memory (ROM), and a random access memory (RAM). In this case, the control circuit loads a program stored in the ROM into the RAM and executes the program by the CPU to perform various processes. The control circuit inputs the same drive signal to each piezoelectric vibrator P1 and each piezoelectric vibrator P2. That is, each piezoelectric vibrator P1 and each piezoelectric vibrator P2 are synchronously driven by the same drive signal.

As described above, in the audio device 1A, the natural frequency of each piezoelectric vibrator P1 is larger than the natural frequency of each piezoelectric vibrator P2. Thus, each piezoelectric vibrator P1 can improve sound quality (sound pressure) in a high range (high frequency range) as compared with each piezoelectric vibrator P2, and each piezoelectric vibrator P2 can improve sound quality in a low range (low frequency range) as compared with each piezoelectric vibrator P1. Accordingly, the audio device 1A can improve sound quality in a wide range (frequency range) while achieving downsizing. That is, the audio device 1A can equalize the sound quality in the entire range (entire frequency range) while achieving downsizing.

When viewed from the third direction D3, a maximum length L1 of each piezoelectric vibrator P1 is shorter than a maximum length L2 of each piezoelectric vibrator P2. Thus, it is possible to easily implement each piezoelectric vibrator P1 having a larger natural frequency than the natural frequency of each piezoelectric vibrator P2.

In order to improve sound quality in a wide range, it is conceivable to drive each piezoelectric vibrator P1 and each piezoelectric vibrator P2 with different drive signals, but the configuration of the control circuit becomes complicated in that case. In the audio device 1A, each piezoelectric vibrator P1 and each piezoelectric vibrator P2 are synchronously driven by the same drive signal, and it is possible to improve sound quality in a wide range while the configuration of the control circuit is prevented from being complicated.

When viewed from the third direction D3, the distance (shortest distance) between each piezoelectric vibrator P1 and each piezoelectric vibrator P2 is shorter than the maximum length L2 of the piezoelectric vibrator P2. As described above, each piezoelectric vibrator P1 and each piezoelectric vibrator P2 are disposed close to each other, and a phase difference hardly occurs. Accordingly, the connection between the sound of each piezoelectric vibrator P1 and the sound of each piezoelectric vibrator P2 is improved.

Second Embodiment

Figure 5:
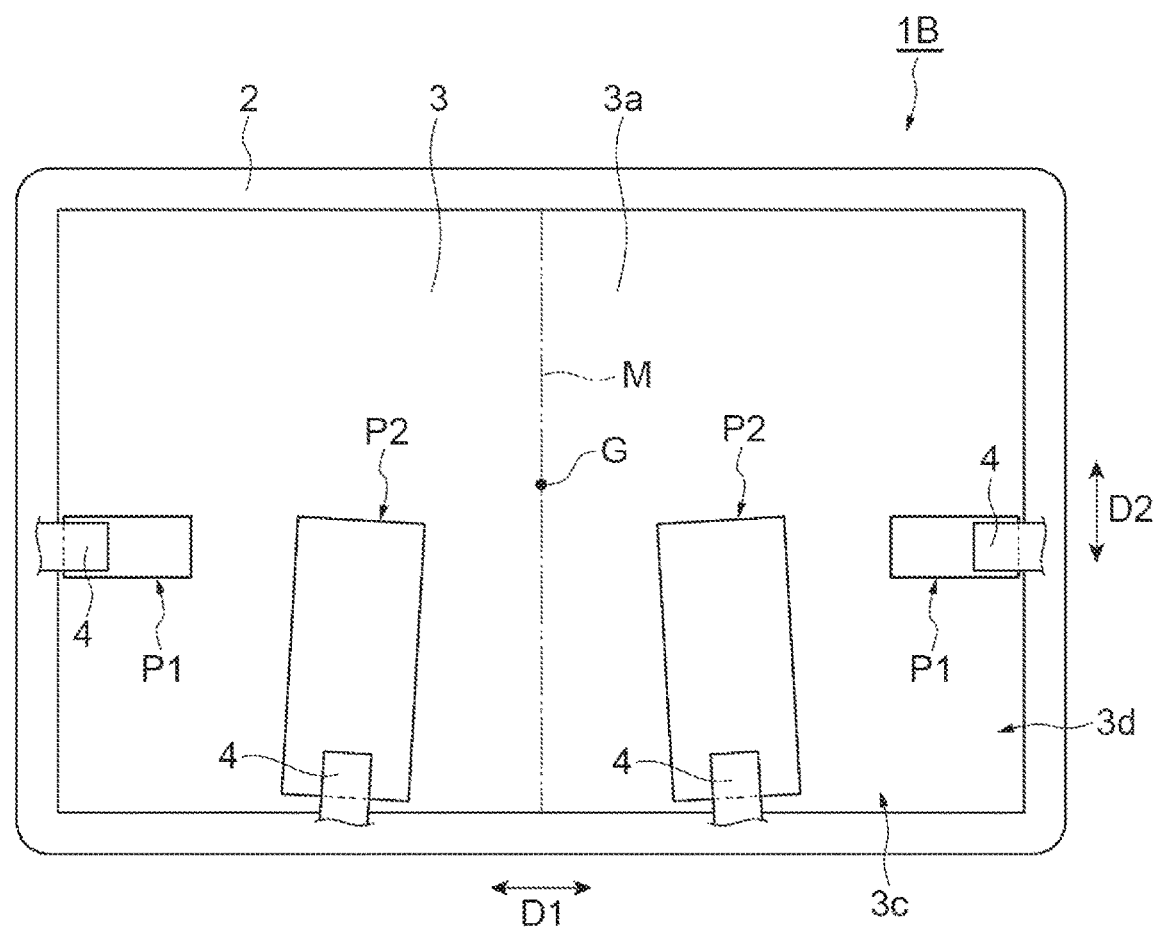
FIG. 5 is a plan view of an audio device according to a second embodiment.

FIG. 5 is a plan view of an audio device according to a second embodiment. As shown in FIGS. 1 and 5, an audio device 1B according to the second embodiment is different from the audio device 1A in that the arrangement of piezoelectric vibrators P2 is different and is the same as the audio device 1A in other points. That is, the audio device 1B also includes a pair of piezoelectric vibrators P1 and a pair of piezoelectric vibrators P2 having different natural frequencies and can improve sound quality in a wide range while achieving downsizing.

Each piezoelectric vibrator P2 is disposed closer to one long side portion 3c than a straight line that passes through the gravity center G and is parallel to the first direction D1. In each piezoelectric vibrator P2, the long-side direction of the main face 11a is not aligned with the first direction D1, and the long-side direction of the main face 11a is inclined with respect to the first direction D1 in such a way that, of both end portions of the piezoelectric vibrator P2 in the long-side direction of the main face 11a, one end portion having a longer distance (shortest distance) from the restraint member 2 is closer to the straight line M than the end portion having a shorter distance (shortest distance) from the restraint member 2. Accordingly, the end portion, which has a longer distance from the restraint member 2, of each piezoelectric vibrator P2 is hardly affected by the restraint force from the restraint member 2 and can efficiently transmit vibration to the vicinity of the gravity center G. Thus, in the audio device 1B, each piezoelectric vibrator P2 can further improve sound quality in a low range.

Third Embodiment

Figure 6:
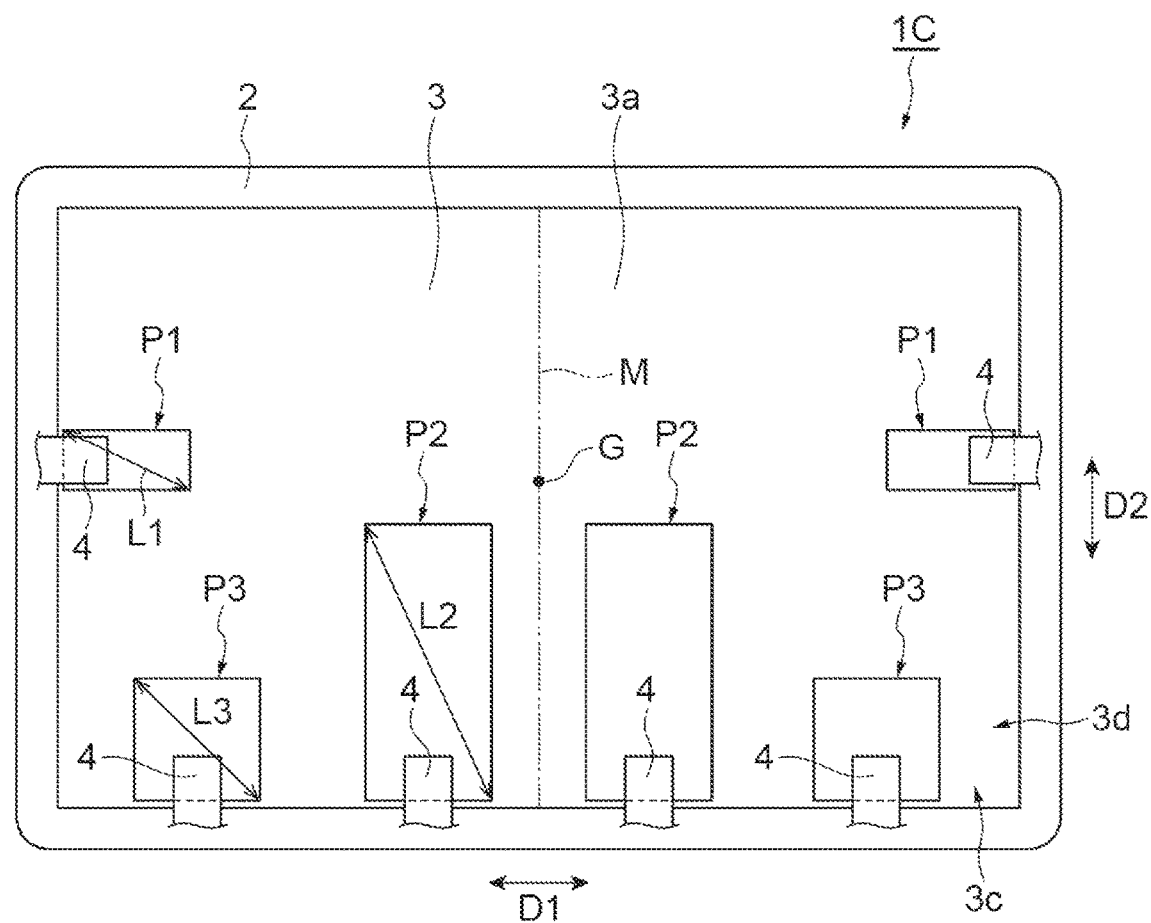
FIG. 6 is a plan view of an audio device according to a third embodiment.

FIG. 6 is a plan view of an audio device according to a third embodiment. As shown in FIGS. 1 and 6, an audio device 1C according to the third embodiment is different from the audio device 1A mainly in including a pair of piezoelectric vibrators P3. The natural frequency of each piezoelectric vibrator P3 is larger than the natural frequency of each piezoelectric vibrator P2 and smaller than the natural frequency of each piezoelectric vibrator P1.

Each piezoelectric vibrator P3 is, for example, a bimorph piezoelectric element. Although not shown, each piezoelectric vibrator P3 includes, similarly to each piezoelectric vibrator P1, a piezoelectric element body 11, external electrodes 13, 14, and 15, internal electrodes 21, 22, and 23, connection conductors 33, 34, and 35, and via conductors 43, 44, and 45 as shown in FIGS. 3 and 4. Each piezoelectric vibrator P3 is different from each piezoelectric vibrator P1 mainly in the shapes of the piezoelectric element body 11 and the internal electrodes 21, 22, and 23 viewed from the third direction D3. Each of the main faces 11a and 11b of the piezoelectric element body 11 of each piezoelectric vibrator P3 has a square shape. The length of one side of each of the main faces 11a and 11b of each piezoelectric vibrator P3 is, for example, 30 mm. The thickness of the piezoelectric element body 11 of each piezoelectric vibrator P3 (the length of the piezoelectric element body 11 in the third direction D3) is, for example, 0.5 mm.

The internal electrodes 21, 22, and 23 of each piezoelectric vibrator P3 each have a shape matching the shape of the piezoelectric element body 11 of the piezoelectric vibrator P3. The external electrodes 13, 14, and 15 of each piezoelectric vibrator P3 are arranged on one side of the main face 11a along the one side. The shapes of the external electrodes 13, 14, and 15, of the connection conductors 33, 34, and 35, and of the via conductors 43, 44, and 45, and a relative positional relation between them are equal between each piezoelectric vibrator P3 and each piezoelectric vibrator P1.

When viewed from the third direction D3, a maximum length L3 of each piezoelectric vibrator P3 is longer than the maximum length L1 of each piezoelectric vibrator P1 and shorter than the maximum length L2 of each piezoelectric vibrator P2. In the present embodiment, each of the main faces 11a and 11b of each piezoelectric vibrator P3 has a square shape, and the maximum length L3 is a length of a diagonal line of each of the main faces 11a and 11b of the piezoelectric vibrator P3, and is, for example, 42 mm.

When viewed from the third direction D3, one of the pair of piezoelectric vibrators P3 is provided in the left region of the straight line M, and the other is provided in the right region. The pair of piezoelectric vibrators P3 is disposed in such a way as to be line-symmetric with respect to the straight line M when viewed from the third direction D3. Each piezoelectric vibrator P3 is disposed in such a way that one side of a pair of sides adjacent to each other of the main face 11a is parallel to the first direction D1 and the other side is aligned with the second direction D2. When viewed from the third direction D3, the piezoelectric vibrators P3 are disposed to be separated from each other in the first direction D1. At least a part of each piezoelectric vibrator P3 is disposed in one long side portion 3c. Specifically, one end portion of the main face 11a in the second direction D2 is disposed in one long side portion 3c. Each piezoelectric vibrator P3 is disposed to be separated from the other long side portion 3c and the pair of short side portions 3d.

When viewed from the third direction D3, each piezoelectric vibrator P3 is disposed to be separated farther from the straight line M than each piezoelectric vibrator P2. When viewed from the third direction D3, the distance (shortest distance) between each piezoelectric vibrator P3 and the straight line M is longer than the distance (shortest distance) between each piezoelectric vibrator P2 and the straight line M. Similarly to each piezoelectric vibrator P1 and each piezoelectric vibrator P2, each piezoelectric vibrator P3 is connected to a wiring member 4. The wiring member 4 is drawn out to the restraint member 2. Each piezoelectric vibrator P3 is synchronously driven by the same drive signal as each piezoelectric vibrator P1 and each piezoelectric vibrator P2.

The audio device 1C further includes the piezoelectric vibrators P3 having a natural frequency smaller than the natural frequency of the piezoelectric vibrators P1 and larger than the natural frequency of the piezoelectric vibrators P2. Thus, the piezoelectric vibrator P3 can improve sound quality in an intermediate range between a high range and a low range. Accordingly, it is possible to improve sound quality in a wider range while downsizing is achieved.

Fourth Embodiment

Figure 7:
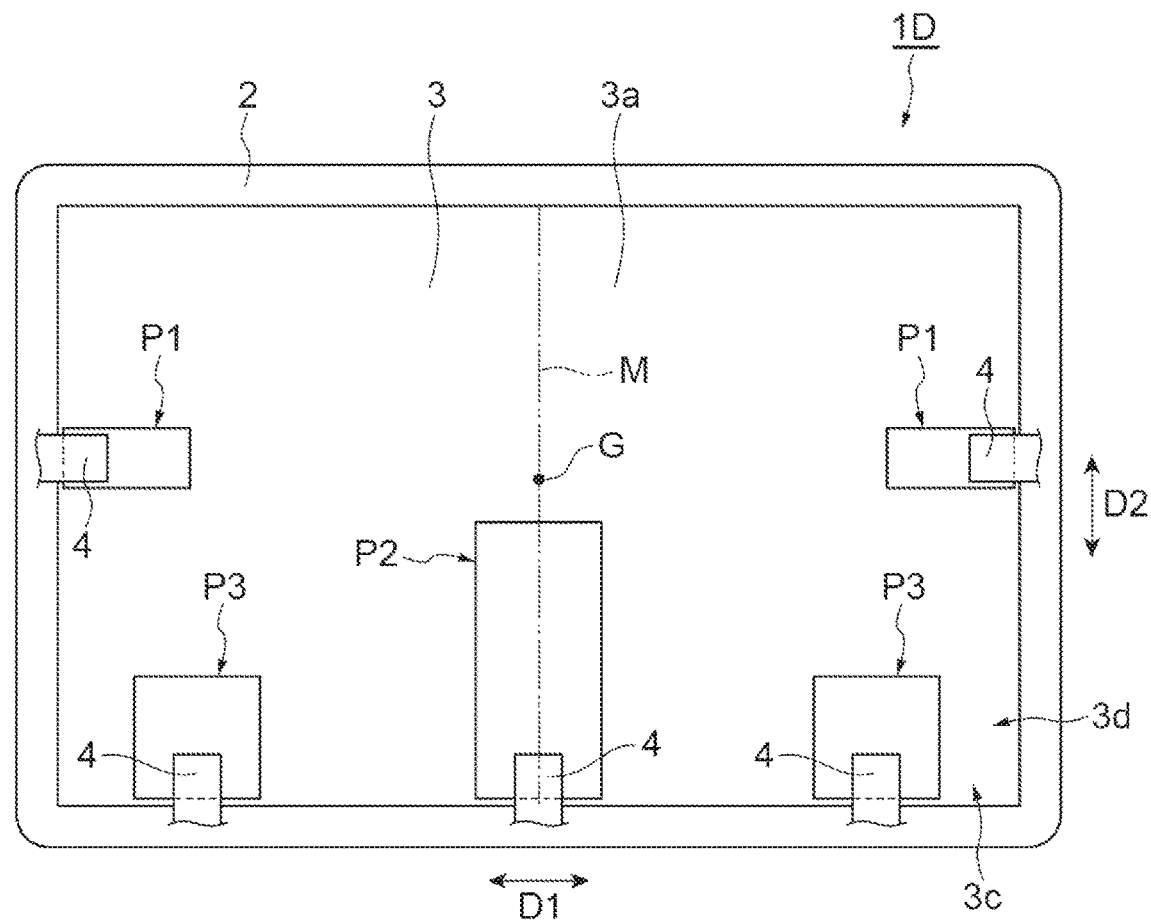
FIG. 7 is a plan view of an audio device according to a fourth embodiment.

FIG. 7 is a plan view of an audio device according to a fourth embodiment. As shown in FIGS. 6 and 7, an audio device 1D according to the fourth embodiment is different from the audio device 1C in the number and arrangement of piezoelectric vibrators P2 and is the same as the audio device 1C in other points. That is, the audio device 1D also includes a pair of piezoelectric vibrators P1, a piezoelectric vibrator P2, and a pair of piezoelectric vibrators P3 having different natural frequencies and can improve sound quality in a wider range while achieving downsizing.

The audio device 1D includes the single piezoelectric vibrator P2. The piezoelectric vibrator P2 is disposed in such a way that the gravity center of the main face 11a of the piezoelectric vibrator P2 overlaps the straight line M when viewed from the third direction D3. That is, when viewed from the third direction D3, the piezoelectric vibrator P2 is bisected in the short-side direction of the main face 11a by the straight line M, and one half is arranged in the left region of the straight line M and the other half is arranged in the right region.

In the audio device 1D, the number of piezoelectric vibrators is fewer than those in the audio device 1C, and it is difficult to improve sound quality in a low range. However, in the low range, the difference between the left region and the right region of the straight line M is difficult to recognize. Thus, according to the audio device 1D, it is possible to simplify the configuration without significantly affecting the sound quality. Accordingly, space saving can be also achieved, for example.

Fifth Embodiment

Figure 8:
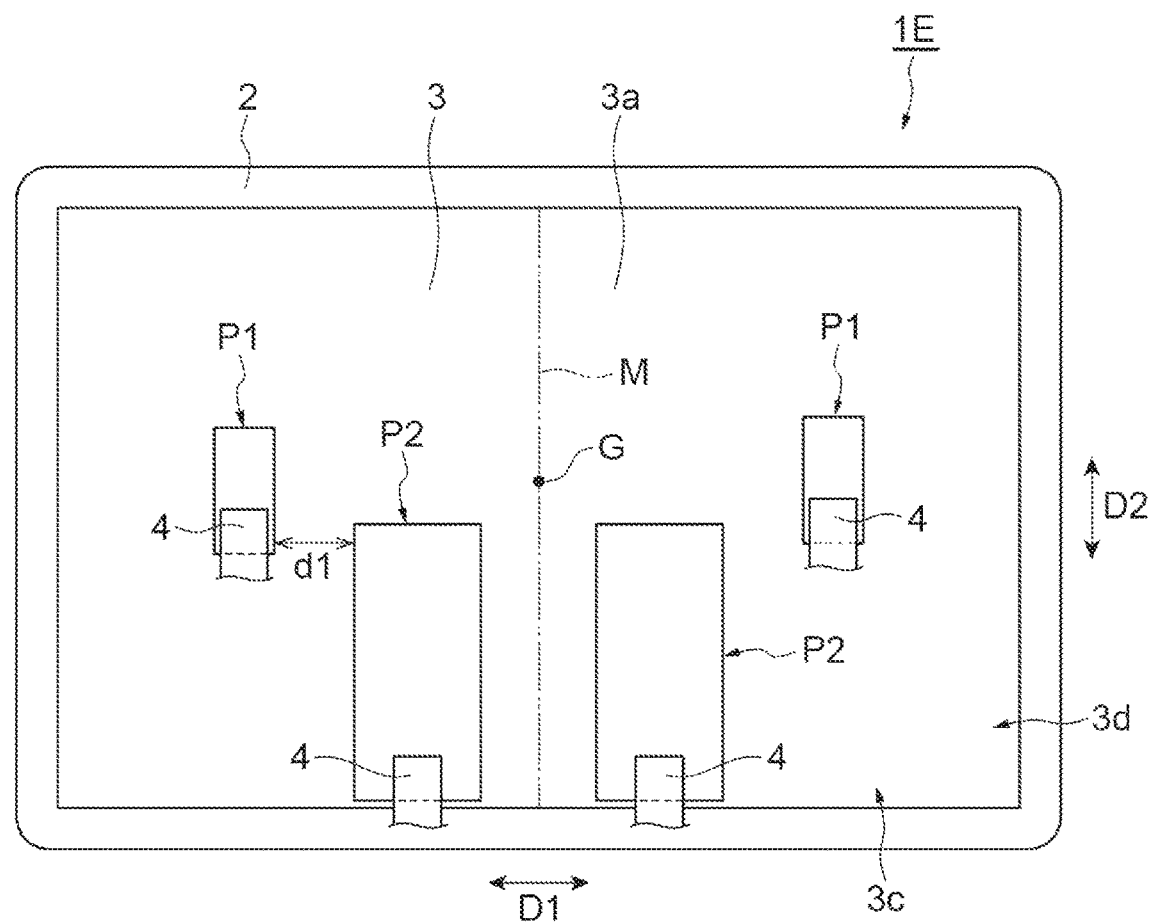
FIG. 8 is a plan view of an audio device according to a fifth embodiment.

FIG. 8 is a plan view of an audio device according to a fifth embodiment. As shown in FIGS. 1 and 8, an audio device 1E according to the fifth embodiment is different from the audio device 1A in that the arrangement of piezoelectric vibrators P1 is different and is the same as the audio device 1A in other points. That is, the audio device 1E also includes a pair of piezoelectric vibrators P1 and a pair of piezoelectric vibrators P2 having different natural frequencies and can improve sound quality in a wide range while achieving downsizing.

In the audio device 1E, each piezoelectric vibrator P1 is disposed in such a way that the long-side direction of the main face 11a is aligned with the second direction D2 and that the short-side direction of the main face 11a is aligned with the first direction D1. In addition, each piezoelectric vibrator P1 is disposed to be separated from the long side portions 3c and the short side portions 3d. When viewed from the third direction D3, the distance (shortest distance) between each piezoelectric vibrator P1 and the restraint member 2 is longer than the distance (shortest distance) between each piezoelectric vibrator P2 and the restraint member 2.

Figure 9:
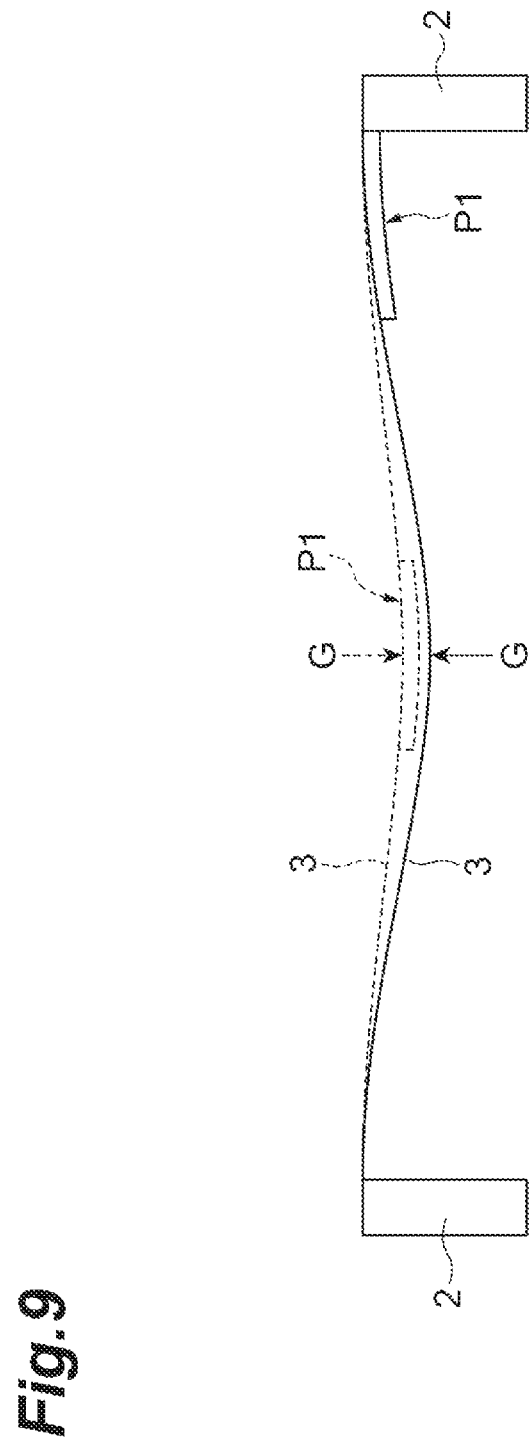
FIG. 9 is a diagram for explaining displacement of a vibration member.

FIG. 9 is a diagram for explaining displacement of a vibration member. In FIG. 9, the displacement of the vibration member 3 when each piezoelectric vibrator P1 is disposed near the restraint member 2 is indicated by a solid line, and the displacement of the vibration member 3 when each piezoelectric vibrator P1 is disposed near the gravity center G of the vibration member 3 is indicated by a broken line. In either case, the magnitude of the drive signal (voltage) applied to each piezoelectric vibrator P1 is the same. Thus, although the displacement of each piezoelectric vibrator P1 is the same, a difference occurs in the displacement of the vibration member 3 depending on the position of the piezoelectric vibrator P1. As each piezoelectric vibrator P1 is closer to the restraint member 2, one end of the piezoelectric vibrator P1 is more easily fixed. As the result, the displacement increases in a low range, and the followability deteriorates in a high range. In contrast, as each piezoelectric vibrator P1 is closer to the gravity center G, the displacement decreases in the low range, and the followability is improved in the high range. Although FIG. 9 shows a case where the piezoelectric vibrator P1 is disposed on the main face 3b (see FIG. 2), a similar difference occurs in the displacement of the vibration member 3 depending on the position of the piezoelectric vibrator P1 if the piezoelectric vibrator P1 is disposed on the main face 3a (see FIG. 2).

As described above, in the audio device 1E, each piezoelectric vibrator P1 is disposed to be separated from the long side portions 3c and the short side portions 3d, and the distance (shortest distance) between each piezoelectric vibrator P1 and the restraint member 2 is longer than the distance (shortest distance) between each piezoelectric vibrator P2 and the restraint member 2 when viewed from the third direction D3. Since each piezoelectric vibrator P1 has a relatively long distance to the restraint member 2 and can further improve sound quality in a high range. Since each piezoelectric vibrator P2 has a relatively short distance to the restraint member 2 and can further improve sound quality in a low range. Accordingly, it is possible to further improve sound quality in a wide range.

Sixth Embodiment

Figure 10:
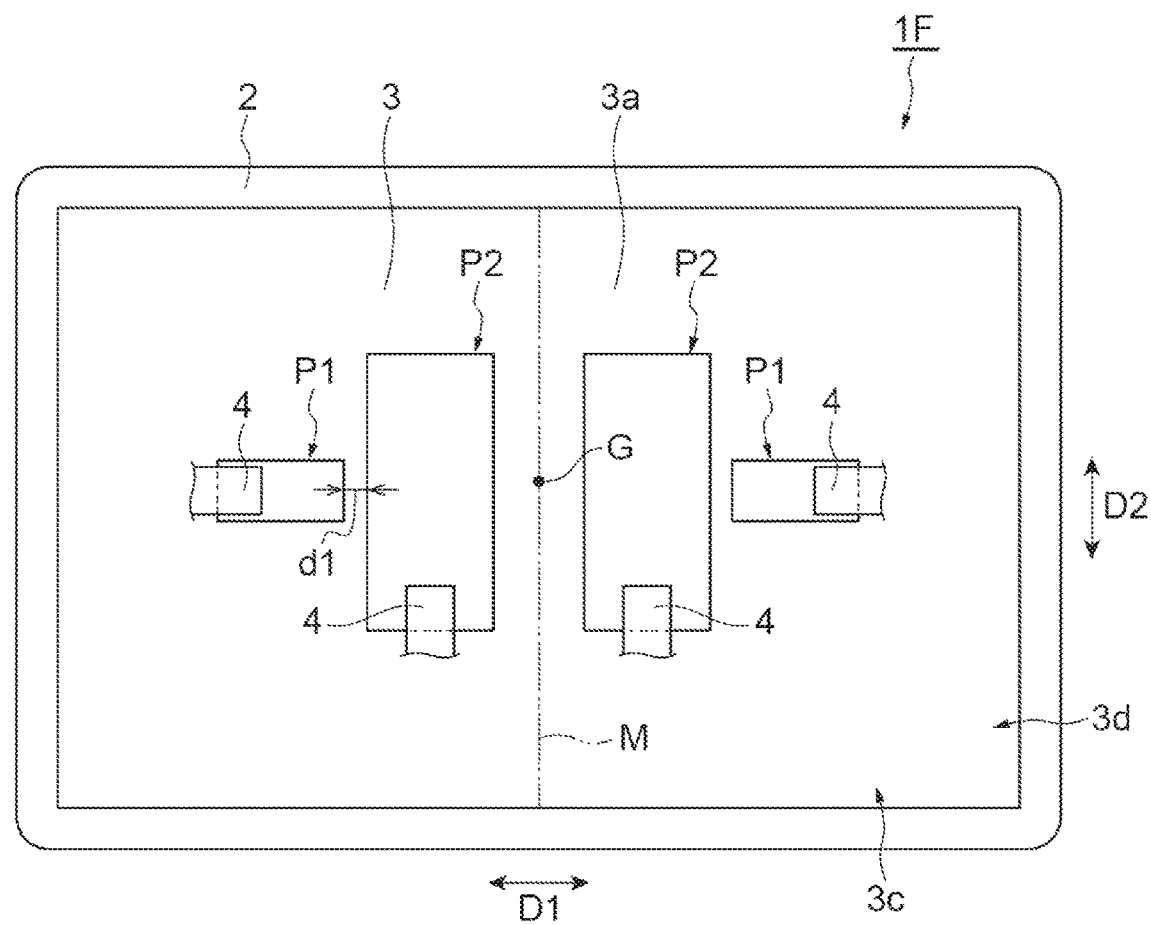
FIG. 10 is a plan view of an audio device according to a sixth embodiment.

FIG. 10 is a plan view of an audio device according to a sixth embodiment. As shown in FIGS. 1 and 10, an audio device 1F according to the sixth embodiment is different from the audio device 1A in that the arrangement of piezoelectric vibrators P1 and piezoelectric vibrators P2 is different and is the same as the audio device 1A in other points. That is, the audio device 1F also includes a pair of piezoelectric vibrators P1 and a pair of piezoelectric vibrators P2 having different natural frequencies and can improve sound quality in a wide range while achieving downsizing.

In the audio device 1F, each piezoelectric vibrator P1 is separated from the short side portions 3d, and each piezoelectric vibrator P2 is separated from the long side portions 3c. As described with reference to FIG. 9, as each piezoelectric vibrator P1 is closer to the gravity center G, the displacement decreases in a low range, and the followability is improved in a high range. Similarly, as each piezoelectric vibrator P2 is closer to the gravity center G, the displacement decreases in a low range, and the followability is improved in a high range. Thus, according to the audio device 1F, it is possible to further improve sound quality in a higher range than the audio device 1E does.

Seventh Embodiment

Figure 11:
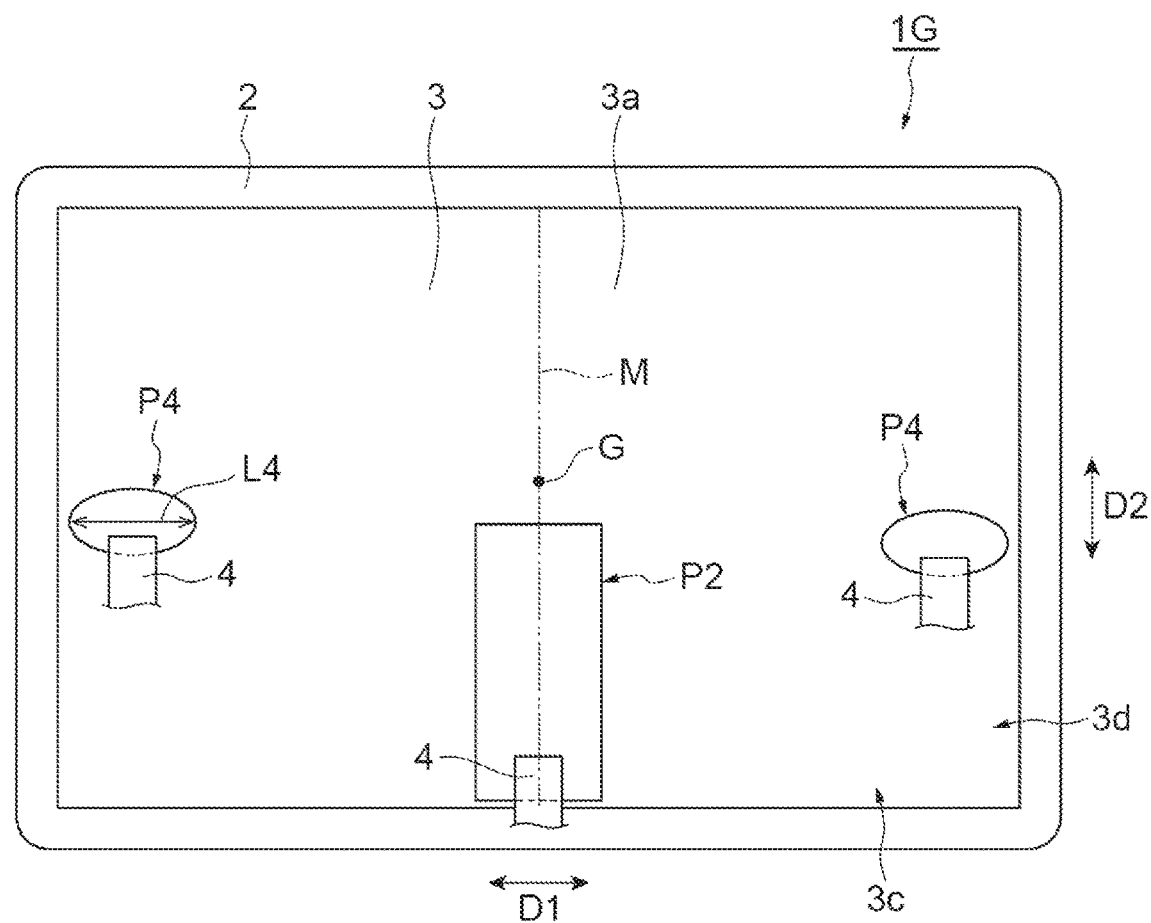
FIG. 11 is a plan view of an audio device according to a seventh embodiment.

FIG. 11 is a plan view of an audio device according to a seventh embodiment. As shown in FIGS. 1 and 11, an audio device 1G according to the seventh embodiment is different from the audio device 1A in that a pair of piezoelectric vibrators P4 is provided instead of the pair of piezoelectric vibrators P1 and that the number and arrangement of piezoelectric vibrators P2 are different and is the same as the audio device 1A in other points. The natural frequency of each piezoelectric vibrator P4 is larger than the natural frequency of each piezoelectric vibrator P1.

Each piezoelectric vibrator P4 is, for example, a bimorph piezoelectric element. Although not shown, each piezoelectric vibrator P4 includes, similarly to each piezoelectric vibrator P1, a piezoelectric element body 11, external electrodes 13, 14, and 15, internal electrodes 21, 22, and 23, connection conductors 33, 34, and 35, and via conductors 43, 44, and 45 as shown in FIGS. 3 and 4. Each piezoelectric vibrator P4 is different from each piezoelectric vibrator P1 mainly in the shapes of the piezoelectric element body 11 and the internal electrodes 21, 22, and 23 viewed from the third direction D3. Each of the main faces 11a and 11b of the piezoelectric element body 11 of each piezoelectric vibrator P4 has an elliptical shape. The length of the major axis of each of the main faces 11a and 11b of each piezoelectric vibrator P4 is, for example, 30 mm, and the length of the minor axis is, for example, 15 mm. The thickness of the piezoelectric element body 11 of each piezoelectric vibrator P4 is equal to the thickness of the piezoelectric element body 11 of each piezoelectric vibrator P1. That is, the thickness of the piezoelectric element body 11 of each piezoelectric vibrator P4 (the length of the piezoelectric element body 11 in the third direction D3) is, for example, 0.7 mm.

The internal electrodes 21, 22, and 23 of each piezoelectric vibrator P4 each have a shape matching the shape of the piezoelectric element body 11 of the piezoelectric vibrator P4. The external electrodes 13, 14, and 15 of each piezoelectric vibrator P4 are disposed on one end side in the minor-axis direction of the main face 11a and are arranged along the major-axis direction of the main face 11a. The shapes of the external electrodes 13, 14, and 15, of the connection conductors 33, 34, and 35, and of the via conductors 43, 44, and 45, and a relative positional relation between them are equal between each piezoelectric vibrator P4 and each piezoelectric vibrator P1.

When viewed from the third direction D3, a maximum length L4 of each piezoelectric vibrator P4 is shorter than the maximum length L1 of each piezoelectric vibrator P1. In the present embodiment, each of the main faces 11a and 11b of each piezoelectric vibrator P4 has an elliptical shape, and the maximum length L4 is the length of the major axis of each of the main faces 11a and 11b of the piezoelectric vibrator P4.

When viewed from the third direction D3, one of the pair of piezoelectric vibrators P4 is provided in the left region of the straight line M, and the other is provided in the right region. The pair of piezoelectric vibrators P4 is disposed in such a way as to be line-symmetric with respect to the straight line M when viewed from the third direction D3. Each piezoelectric vibrator P4 is disposed in such a way that the major-axis direction of the main face 11a is aligned with the first direction D1 and that the minor-axis direction of the main face 11a is aligned with the second direction D2. When viewed from the third direction D3, the piezoelectric vibrators P4 are disposed to be separated from each other in the first direction D1. At least a part of each piezoelectric vibrator P4 is disposed in the short side portion 3d. Specifically, one end portion of the main face 11a in the major-axis direction is disposed in each short side portion 3d. Each piezoelectric vibrator P4 is disposed to be separated from the pair of long side portions 3c.

When viewed from the third direction D3, each piezoelectric vibrator P4 is disposed to be separated farther from the straight line M than the piezoelectric vibrator P2. Similarly to the piezoelectric vibrator P2, each piezoelectric vibrator P4 is connected to a wiring member 4. Each piezoelectric vibrator P4 is synchronously driven by the same drive signal as the piezoelectric vibrator P2.

The audio device 1G includes the single piezoelectric vibrator P2. The piezoelectric vibrator P2 is disposed in such a way that the gravity center of the main face 11a of the piezoelectric vibrator P2 overlaps the straight line M when viewed from the third direction D3. That is, the piezoelectric vibrator P2 is bisected in the short-side direction of the main face 11a by the straight line M when viewed from the third direction D3, and one half is arranged in the left region of the straight line M and the other half is arranged in the right region when viewed from the third direction D3.

The audio device 1G also includes the piezoelectric vibrators P2 and the piezoelectric vibrators P4 having different natural frequencies and can improve sound quality in a wide range while achieving downsizing. In addition, in the audio device 1G, the number of piezoelectric vibrators P2 is fewer than those in the audio device 1A, and it is difficult to improve sound quality in a low range. However, in the low range, the difference between the left region and the right region of the straight line M is difficult to recognize. Thus, according to the audio device 1G, it is possible to simplify the configuration without significantly affecting the sound quality. Accordingly, space saving can be also achieved, for example.

Eighth Embodiment

Figure 12:
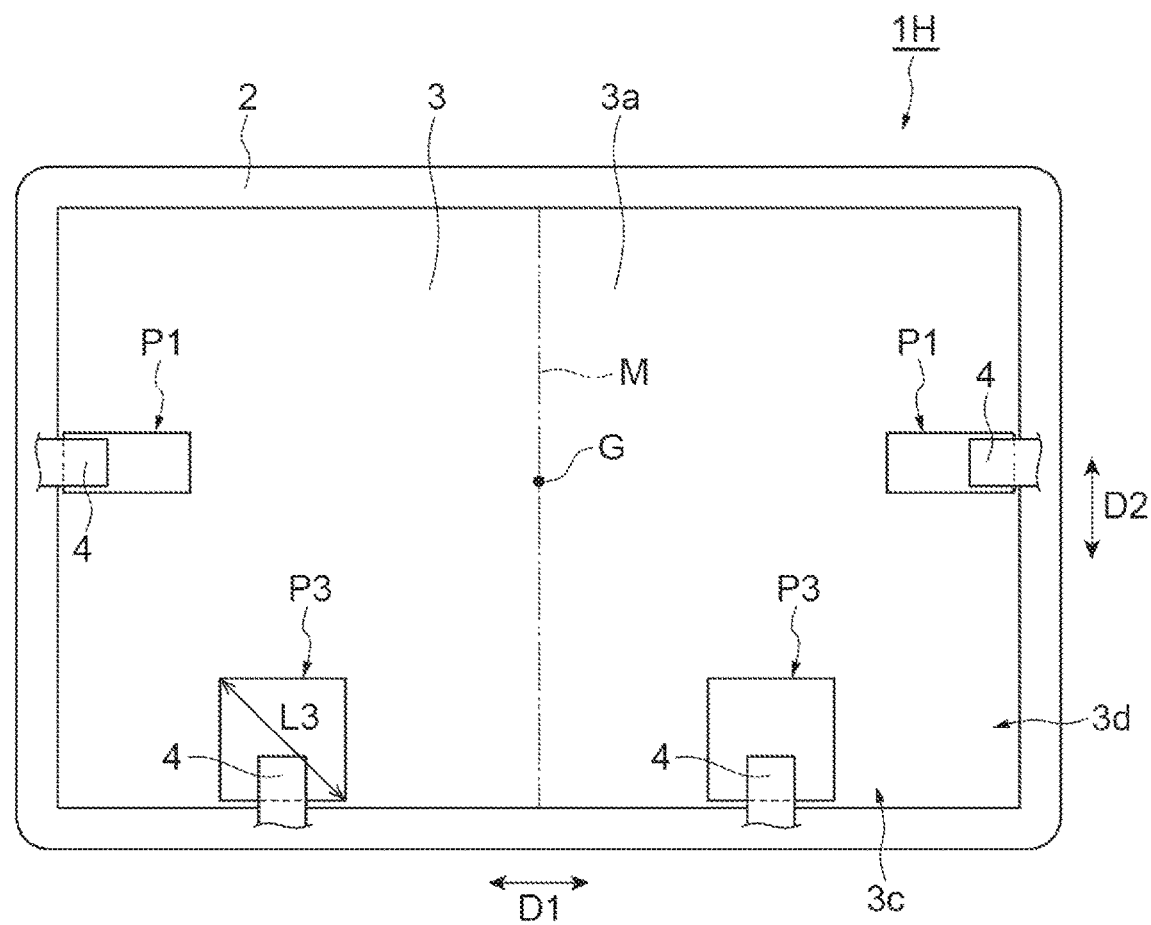
FIG. 12 is a plan view of an audio device according to an eighth embodiment.

FIG. 12 is a plan view of an audio device according to an eighth embodiment. As shown in FIGS. 1 and 12, an audio device 1H according to the eighth embodiment is different from the audio device 1A in including a pair of piezoelectric vibrators P3 instead of the pair of piezoelectric vibrators P2 and is the same as the audio device 1A in other points. That is, the audio device 1H also includes a pair of piezoelectric vibrators P1 and a pair of piezoelectric vibrators P3 having different natural frequencies and can improve sound quality in a wide range while achieving downsizing.

When viewed from the third direction D3, one of the pair of piezoelectric vibrators P3 is provided in the left region of the straight line M, and the other is provided in the right region. The pair of piezoelectric vibrators P3 is disposed in such a way as to be line-symmetric with respect to the straight line M when viewed from the third direction D3. Each piezoelectric vibrator P3 is disposed in such a way that one side of a pair of sides adjacent to each other of the main face 11a is parallel to the first direction D1 and the other side is aligned with the second direction D2. When viewed from the third direction D3, the piezoelectric vibrators P3 are disposed to be separated from each other in the first direction D1. At least a part of each piezoelectric vibrator P3 is disposed in one long side portion 3c. Specifically, one end portion of the main face 11a in the second direction D2 is disposed in one long side portion 3c. Each piezoelectric vibrator P3 is disposed to be separated from the other long side portion 3c and the pair of short side portions 3d.

When viewed from the third direction D3, each piezoelectric vibrator P3 is disposed closer to the straight line M than each piezoelectric vibrator P1. When viewed from the third direction D3, the distance (shortest distance) between each piezoelectric vibrator P3 and the straight line M is shorter than the distance (shortest distance) between each piezoelectric vibrator P1 and the straight line M. Each piezoelectric vibrator P3 is connected to a wiring member 4. The wiring member 4 is drawn out to the restraint member 2. Each piezoelectric vibrator P3 is synchronously driven by the same drive signal as each piezoelectric vibrator P1.

The audio device 1H includes the piezoelectric vibrators P3 having a natural frequency larger than the natural frequency of the piezoelectric vibrators P2. Thus, the audio device 1H can improve sound quality in a higher range than the audio device 1A does.

In the audio device 1H, when viewed from the third direction D3, the distance (shortest distance) between each piezoelectric vibrator P1 and each piezoelectric vibrator P3 is longer than the maximum length L3 of the piezoelectric vibrator P3. As described above, each piezoelectric vibrator P1 and each piezoelectric vibrator P3 are not disposed close to each other, and it is possible for the sound of each piezoelectric vibrator P1 and the sound of each piezoelectric vibrator P3 to be independent sounds.

Ninth Embodiment

Figure 13:
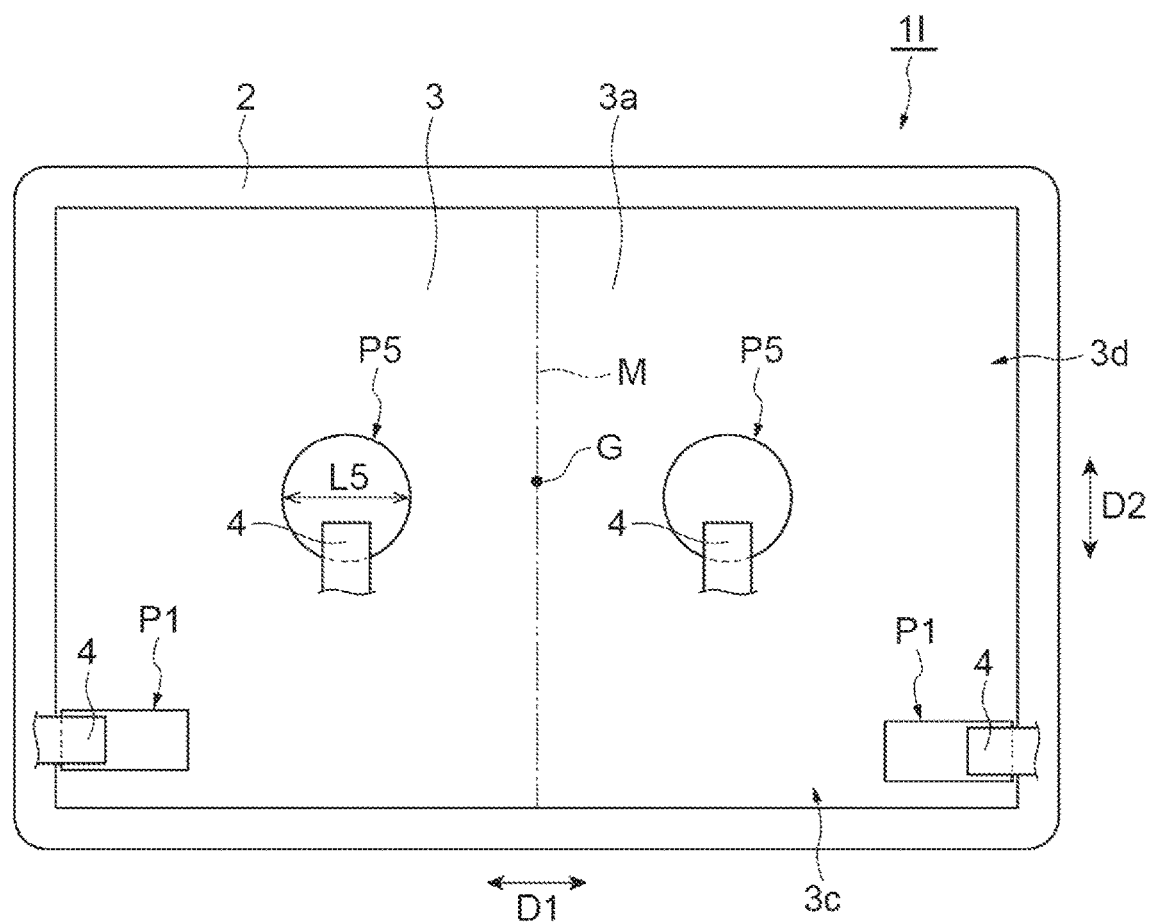
FIG. 13 is a plan view of an audio device according to a ninth embodiment.

FIG. 13 is a plan view of an audio device according to a ninth embodiment. As shown in FIGS. 12 and 13, an audio device 1I according to the ninth embodiment is different from the audio device 1H in that a pair of piezoelectric vibrators P5 is provided instead of the pair of piezoelectric vibrators P3 and that the arrangement of piezoelectric vibrators P1 is different and is the same as the audio device 1H in other points. The natural frequency of each piezoelectric vibrator P5 is larger than the natural frequencies of each piezoelectric vibrator P3 and each piezoelectric vibrator P1.

Each piezoelectric vibrator P5 is, for example, a bimorph piezoelectric element. Although not shown, each piezoelectric vibrator P5 includes, similarly to each piezoelectric vibrator P1, a piezoelectric element body 11, external electrodes 13, 14, and 15, internal electrodes 21, 22, and 23, connection conductors 33, 34, and 35, and via conductors 43, 44, and 45 as shown in FIGS. 3 and 4. Each piezoelectric vibrator P5 is different from each piezoelectric vibrator P1 mainly in the shapes of the piezoelectric element body 11 and the internal electrodes 21, 22, and 23 viewed from the third direction D3. Each of the main faces 11a and 11b of the piezoelectric element body 11 of each piezoelectric vibrator P5 has a circular shape. The diameter of each of the main faces 11a and 11b of each piezoelectric vibrator P5 is, for example, 30 mm. The thickness of the piezoelectric element body 11 of each piezoelectric vibrator P5 is equal to the thickness of the piezoelectric element body 11 of each piezoelectric vibrator P1. That is, the thickness of the piezoelectric element body 11 of each piezoelectric vibrator P5 (the length of the piezoelectric element body 11 in the third direction D3) is, for example, 0.7 mm.

The internal electrodes 21, 22, and 23 of each piezoelectric vibrator P5 each have a shape matching the shape of the piezoelectric element body 11 of the piezoelectric vibrator P5. The external electrodes 13, 14, and 15 of each piezoelectric vibrator P5 are arranged to be shifted from the center of the main face 11a. The shapes of the external electrodes 13, 14, and 15, of the connection conductors 33, 34, and 35, and of the via conductors 43, 44, and 45, and a relative positional relation between them are equal between each piezoelectric vibrator P5 and each piezoelectric vibrator P1.

When viewed from the third direction D3, a maximum length L5 of each piezoelectric vibrator P5 is longer than the maximum length L1 of each piezoelectric vibrator P1 and shorter than the maximum length L2 of each piezoelectric vibrator P2. In the present embodiment, each of the main faces 11a and 11b of each piezoelectric vibrator P5 has a circular shape, and the maximum length L5 is the diameter of each of the main faces 11a and 11b of the piezoelectric vibrator P5.

When viewed from the third direction D3, one of the pair of piezoelectric vibrators P5 is provided in the left region of the straight line M, and the other is provided in the right region. The pair of piezoelectric vibrators P5 is disposed in such a way as to be line-symmetric with respect to the straight line M when viewed from the third direction D3. When viewed from the third direction D3, the piezoelectric vibrators P5 are disposed to be separated from each other in the first direction D1. Each piezoelectric vibrator P5 is disposed to be separated from one long side portion 3c and the pair of short side portions 3d.

When viewed from the third direction D3, each piezoelectric vibrator P5 is disposed closer to the straight line M than each piezoelectric vibrator P1. When viewed from the third direction D3, the distance (shortest distance) between each piezoelectric vibrator P5 and the straight line M is shorter than the distance (shortest distance) between each piezoelectric vibrator P1 and the straight line M. Similarly to each piezoelectric vibrator P1, each piezoelectric vibrator P5 is connected to a wiring member 4. Each piezoelectric vibrator P5 is synchronously driven by the same drive signal as each piezoelectric vibrator P1. When viewed from the third direction D3, each piezoelectric vibrator P1 is disposed at a corner portion of the main face 3a, that is, at an intersection of each long side portion 3c and each short side portion 3d.

The audio device 1I also includes the piezoelectric vibrators P1 and the piezoelectric vibrators P5 having different natural frequencies and can improve sound quality in a wide range while achieving downsizing. According to the audio device 1I, it is possible to improve sound quality in a higher range than the audio device 1H does.

Tenth Embodiment

Figure 14:
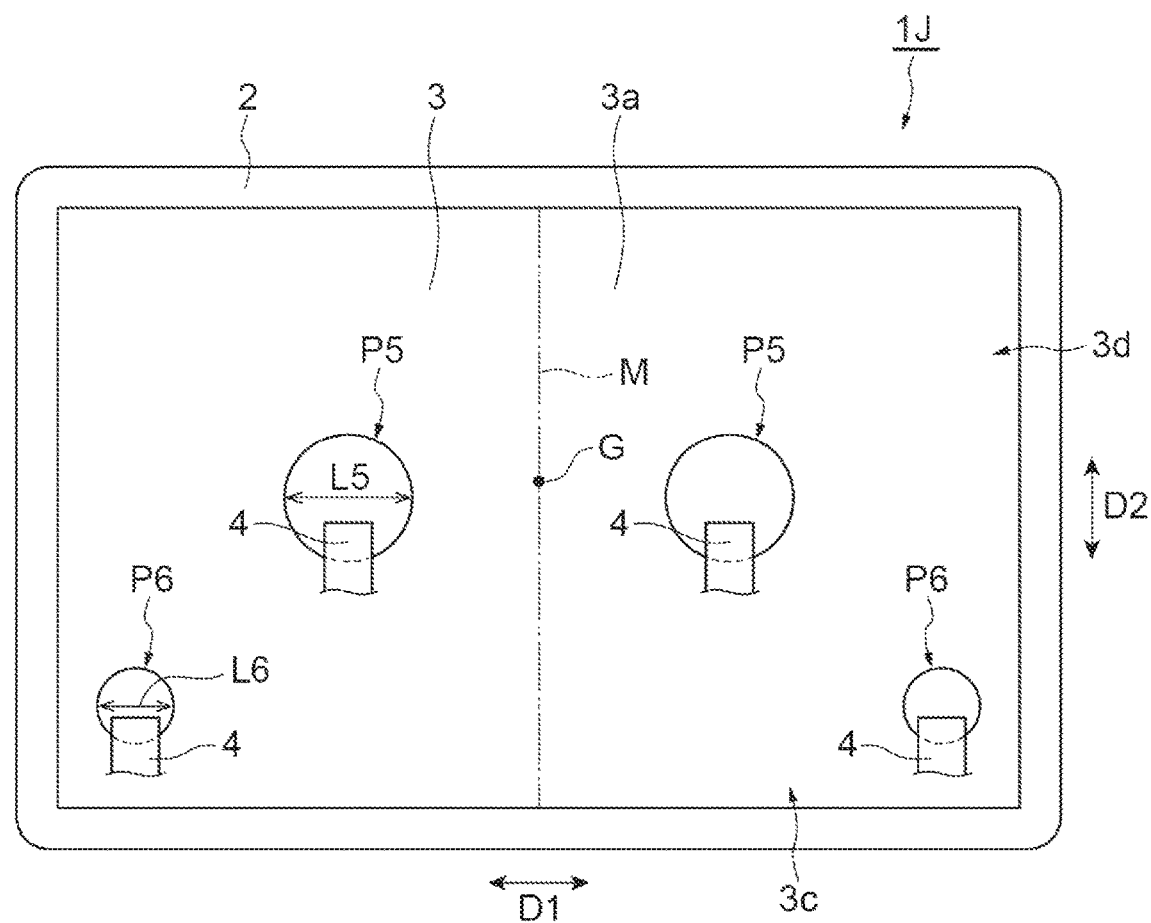
FIG. 14 is a plan view of an audio device according to a tenth embodiment.

FIG. 14 is a plan view of an audio device according to a tenth embodiment. As shown in FIGS. 13 and 14, an audio device 1J according to the tenth embodiment is different from the audio device 1I in including a pair of piezoelectric vibrators P6 instead of the pair of piezoelectric vibrators P1 and is the same as the audio device 1I in other points. The natural frequency of each piezoelectric vibrator P6 is larger than the natural frequencies of each piezoelectric vibrator P1 and each piezoelectric vibrator P5.

Each piezoelectric vibrator P6 is, for example, a bimorph piezoelectric element. Although not shown, each piezoelectric vibrator P6 includes, similarly to each piezoelectric vibrator P1, a piezoelectric element body 11, external electrodes 13, 14, and 15, internal electrodes 21, 22, and 23, connection conductors 33, 34, and 35, and via conductors 43, 44, and 45 as shown in FIGS. 3 and 4. Each piezoelectric vibrator P6 is different from each piezoelectric vibrator P1 mainly in the shapes of the piezoelectric element body 11 and the internal electrodes 21, 22, and 23 viewed from the third direction D3. Each of the main faces 11a and 11b of the piezoelectric element body 11 of each piezoelectric vibrator P6 has a circular shape. The diameter of each of the main faces 11a and 11b of each piezoelectric vibrator P6 is, for example, 20 mm. The main faces 11a and 11b of each piezoelectric vibrator P6 are similar to the main faces 11a and 11b of each piezoelectric vibrator P5. The thickness of the piezoelectric element body 11 of each piezoelectric vibrator P6 (the length of the piezoelectric element body 11 in the third direction D3) is, for example, 0.5 mm.

The internal electrodes 21, 22, and 23 of each piezoelectric vibrator P6 each have a shape matching the shape of the piezoelectric element body 11 of the piezoelectric vibrator P6. The external electrodes 13, 14, and 15 of each piezoelectric vibrator P6 are arranged to be shifted from the center of the main face 11a. The shapes of the external electrodes 13, 14, and 15, of the connection conductors 33, 34, and 35, and of the via conductors 43, 44, and 45, and a relative positional relation between them are equal between each piezoelectric vibrator P6 and each piezoelectric vibrator P1.

When viewed from the third direction D3, a maximum length L6 of each piezoelectric vibrator P6 is shorter than the maximum length L5 of each piezoelectric vibrator P5. In the present embodiment, each of the main faces 11a and 11b of each piezoelectric vibrator P6 has a circular shape, and the maximum length L6 is the diameter of each of the main faces 11a and 11b of the piezoelectric vibrator P6.

When viewed from the third direction D3, one of the pair of piezoelectric vibrators P6 is provided in the left region of the straight line M, and the other is provided in the right region. The pair of piezoelectric vibrators P6 is disposed in such a way as to be line-symmetric with respect to the straight line M when viewed from the third direction D3. When viewed from the third direction D3, the piezoelectric vibrators P6 are disposed to be separated from each other in the first direction D1. When viewed from the third direction D3, each piezoelectric vibrator P6 is disposed at a corner portion of the main face 3a, that is, at each intersection of one long side portion 3c and the short side portions 3d.

When viewed from the third direction D3, each piezoelectric vibrator P6 is disposed to be separated farther from the straight line M than each piezoelectric vibrator P5. When viewed from the third direction D3, the distance (shortest distance) between each piezoelectric vibrator P6 and the straight line M is longer than the distance (shortest distance) between each piezoelectric vibrator P5 and the straight line M. Similarly to each piezoelectric vibrator P5, each piezoelectric vibrator P6 is connected to a wiring member 4. Each piezoelectric vibrator P6 is synchronously driven by the same drive signal as each piezoelectric vibrator P5.

The audio device 1J also includes the piezoelectric vibrators P5 and the piezoelectric vibrators P6 having different natural frequencies and can improve sound quality in a wide range while achieving downsizing. According to the audio device 1J, it is possible to improve sound quality in a higher range than the audio device 1I does.

Eleventh Embodiment

Figure 15:
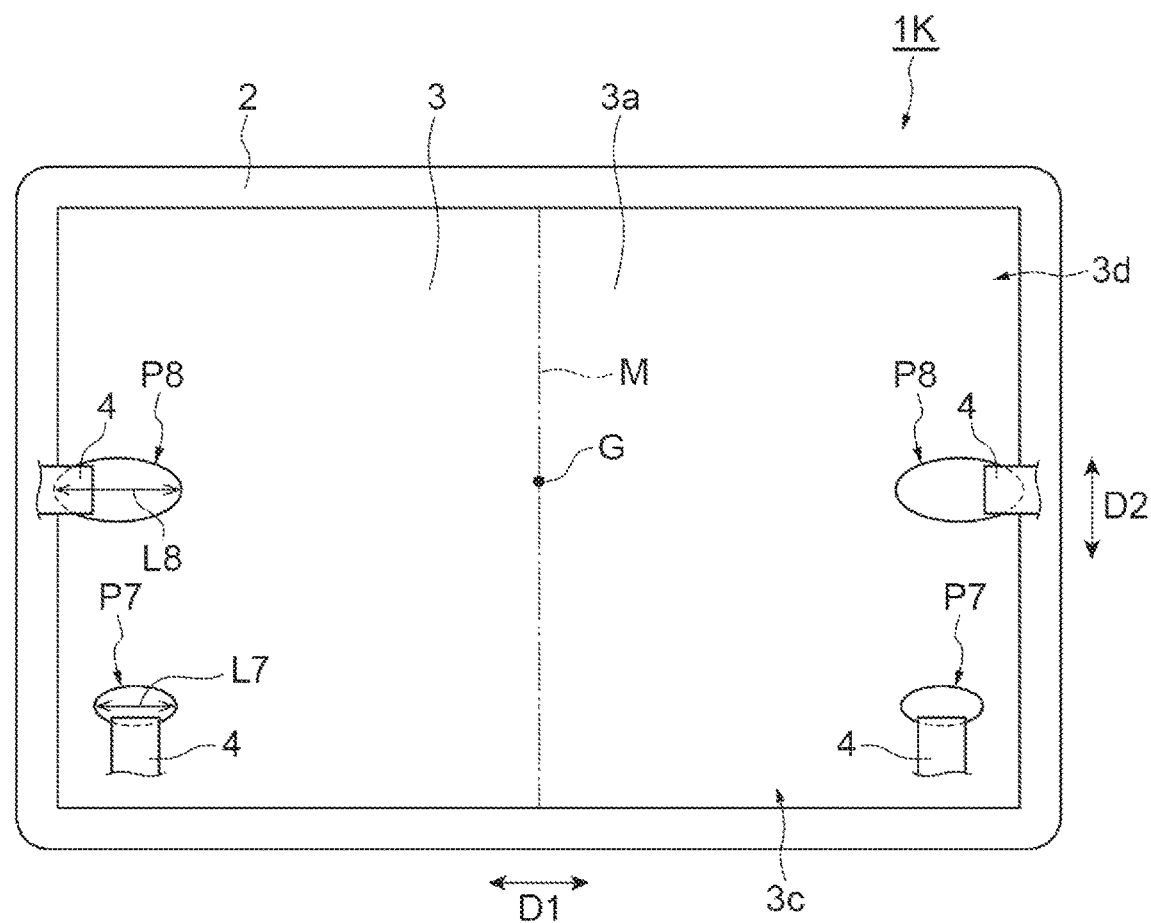
FIG. 15 is a plan view of an audio device according to an eleventh embodiment.

FIG. 15 is a plan view of an audio device according to an eleventh embodiment. As shown in FIGS. 12 and 15, an audio device 1K according to the eleventh embodiment is different from the audio device 1H in including a pair of piezoelectric vibrators P7 instead of the pair of piezoelectric vibrators P3 and including a pair of piezoelectric vibrators P8 instead of the pair of piezoelectric vibrators P1 and is the same as the audio device 1H in other points. The natural frequency of each piezoelectric vibrator P7 is larger than the natural frequency of each piezoelectric vibrator P8. That is, the audio device 1K also includes the piezoelectric vibrators P7 and the piezoelectric vibrators P8 having different natural frequencies and can improve sound quality in a wide range while achieving downsizing. The natural frequency of each piezoelectric vibrator P7 is larger than the natural frequency of each piezoelectric vibrator P3. The natural frequency of each piezoelectric vibrator P8 is larger than the natural frequency of each piezoelectric vibrator P1.

Each of piezoelectric vibrators P7 and P8 is, for example, a bimorph piezoelectric element. Although not shown, each of the piezoelectric vibrators P7 and P8 includes, similarly to each piezoelectric vibrator P1, a piezoelectric element body 11, external electrodes 13, 14, and 15, internal electrodes 21, 22, and 23, connection conductors 33, 34, and 35, and via conductors 43, 44, and 45 as shown in FIGS. 3 and 4. Each of the piezoelectric vibrators P7 and P8 is different from each piezoelectric vibrator P1 mainly in the shapes of the piezoelectric element body 11 and the internal electrodes 21, 22, and 23 viewed from the third direction D3. Each of the main faces 11a and 11b of the piezoelectric element body 11 of each of the piezoelectric vibrators P7 and P8 has an elliptical shape.

Each of the main faces 11a and 11b of the piezoelectric element body 11 of each piezoelectric vibrator P7 is similar to each of the main faces 11a and 11b of the piezoelectric element body 11 of each piezoelectric vibrator P8. Each of the main faces 11a and 11b of the piezoelectric element body 11 of each piezoelectric vibrator P8 has the same shape as each of the main faces 11a and 11b of the piezoelectric element body 11 of each piezoelectric vibrator P4 (see FIG. 11). The length of the major axis of each of the main faces 11a and 11b of each piezoelectric vibrator P7 is, for example, 20 mm, and the length of the minor axis is, for example, 10 mm. The length of the major axis of each of the main faces 11a and 11b of each piezoelectric vibrator P8 is, for example, 30 mm, and the length of the minor axis is, for example, 15 mm. The thickness of the piezoelectric element body 11 of each of the piezoelectric vibrators P7 and P8 (the length of the piezoelectric element body 11 in the third direction D3) is, for example, 0.5 mm.

The internal electrodes 21, 22, and 23 of each of the piezoelectric vibrators P7 and P8 each have a shape matching the shape of the piezoelectric element body 11 of the piezoelectric vibrators P7 and P8. The external electrodes 13, 14, and 15 of each piezoelectric vibrator P7 are disposed on one end side in the minor-axis direction of the main face 11a and are arranged along the major-axis direction of the main face 11a. The external electrodes 13, 14, and 15 of each piezoelectric vibrator P8 are disposed on one end side in the major-axis direction of the main face 11a and are arranged along the minor-axis direction of the main face 11a. The shapes of the external electrodes 13, 14, and 15, of the connection conductors 33, 34, and 35, and of the via conductors 43, 44, and 45, and a relative positional relation between them are equal between each of the piezoelectric vibrators P7 and P8 and each piezoelectric vibrator P1.

When viewed from the third direction D3, a maximum length L7 of each piezoelectric vibrator P7 is shorter than a maximum length L8 of each piezoelectric vibrator P8. In the present embodiment, each of the main faces 11a and 11b of each of the piezoelectric vibrators P7 and P8 has an elliptical shape, and the maximum lengths L7 and L8 are the length of the major axis of each of the main faces 11a and 11b of each of the piezoelectric vibrators P7 and P8. The maximum length L8 is the same as the maximum length L4 (see FIG. 11).

When viewed from the third direction D3, one of the pair of piezoelectric vibrators P7 is provided in the left region of the straight line M, and the other is provided in the right region. The pair of piezoelectric vibrators P7 is disposed in such a way as to be line-symmetric with respect to the straight line M when viewed from the third direction D3. Each piezoelectric vibrator P7 is disposed in such a way that the major-axis direction of the main face 11a is aligned with the first direction D1 and that the minor-axis direction of the main face 11a is aligned with the second direction D2. When viewed from the third direction D3, the piezoelectric vibrators P7 are disposed to be separated from each other in the first direction D1. When viewed from the third direction D3, each piezoelectric vibrator P7 is disposed at a corner portion of the main face 3a, that is, at an intersection of each long side portion 3c and each short side portion 3d.

When viewed from the third direction D3, one of the pair of piezoelectric vibrators P8 is provided in the left region of the straight line M, and the other is provided in the right region. The pair of piezoelectric vibrators P8 is disposed in such a way as to be line-symmetric with respect to the straight line M when viewed from the third direction D3. Each piezoelectric vibrator P8 is disposed in such a way that the major-axis direction of the main face 11a is aligned with the first direction D1 and that the minor-axis direction of the main face 11a is aligned with the second direction D2. When viewed from the third direction D3, the piezoelectric vibrators P8 are disposed to be separated from each other in the first direction D1. At least a part of each piezoelectric vibrator P8 is disposed in each short side portion 3d. Specifically, one end portion of the main face 11a in the major-axis direction is disposed in each short side portion 3d. Each piezoelectric vibrator P8 is disposed to be separated from the pair of long side portions 3c.

When viewed from the third direction D3, each piezoelectric vibrator P7 and each piezoelectric vibrator P8 are arranged side by side along each short side portion 3d. Each of the piezoelectric vibrators P7 and P8 is connected to a wiring member 4. Each of the piezoelectric vibrators P7 and P8 is synchronously driven by the same drive signal.

As described above, the audio device 1K includes the piezoelectric vibrators P8 having a natural frequency larger than the natural frequency of the piezoelectric vibrators P1 and the piezoelectric vibrators P7 having a natural frequency larger than the natural frequency of the piezoelectric vibrators P3. Thus, the audio device 1K can improve sound quality in a higher range than the audio device 1H does.

Twelfth Embodiment

Figure 16:
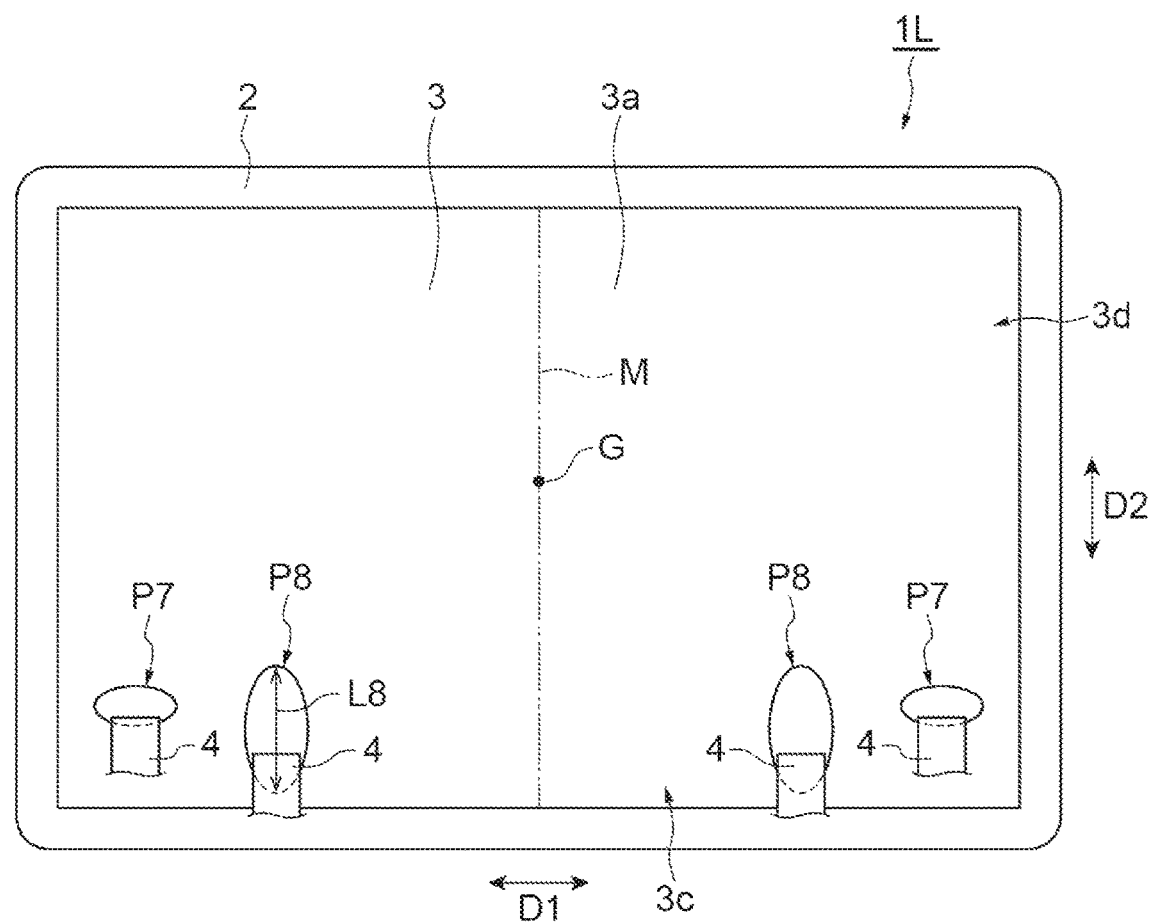
FIG. 16 is a plan view of an audio device according to a twelfth embodiment.

FIG. 16 is a plan view of an audio device according to a twelfth embodiment. As shown in FIGS. 15 and 16, an audio device 1L according to the twelfth embodiment is different from the audio device 1K in that the arrangement of piezoelectric vibrators P8 is different and is the same as the audio device 1K in other points. That is, the audio device 1L also includes a pair of piezoelectric vibrators P7 and a pair of piezoelectric vibrators P8 having different natural frequencies and can improve sound quality in a wide range while achieving downsizing.

In the audio device 1L, each piezoelectric vibrator P8 is disposed in such a way that the major-axis direction of the main face 11a is aligned with the second direction D2 and that the minor-axis direction of the main face 11a is aligned with the first direction D1. At least a part of each piezoelectric vibrator P8 is disposed in one long side portion 3c. Specifically, one end portion of the main face 11a in the major-axis direction is disposed in one long side portion 3c. Each piezoelectric vibrator P8 is disposed to be separated from the pair of short side portions 3d. Each piezoelectric vibrator P8 is arranged side by side with each piezoelectric vibrator P7 along the one long side portion 3c. Each piezoelectric vibrator P8 is disposed closer to the straight line M than each piezoelectric vibrator P7.

When viewed from the third direction D3, the distance (shortest distance) between each piezoelectric vibrator P7 and each piezoelectric vibrator P8 is shorter than the maximum length L8 of the piezoelectric vibrator P8. In this manner, each piezoelectric vibrator P7 and each piezoelectric vibrator P8 are disposed close to each other, and a phase difference hardly occurs. Accordingly, the connection between the sound of each piezoelectric vibrator P7 and the sound of each piezoelectric vibrator P8 is improved.

Thirteenth Embodiment

Figure 17:
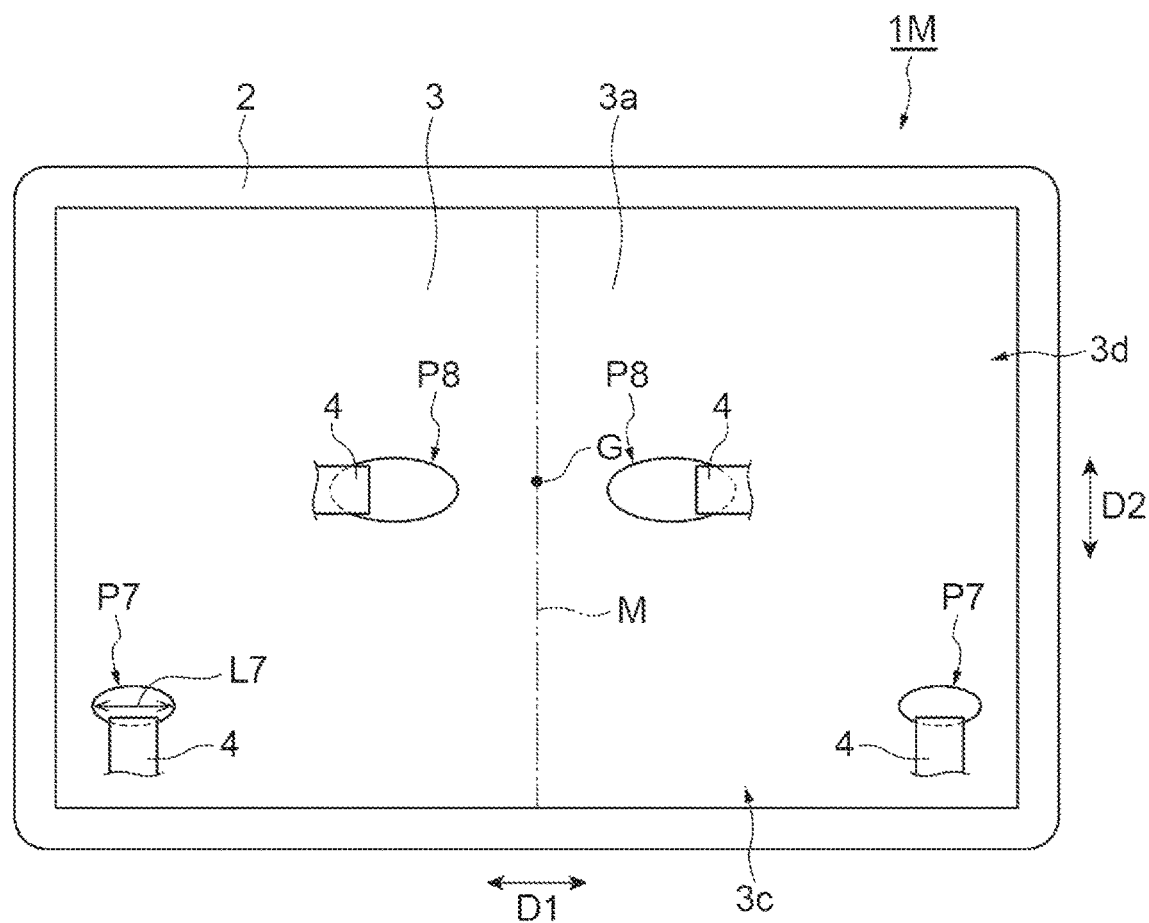
FIG. 17 is a plan view of an audio device according to a thirteenth embodiment.

FIG. 17 is a plan view of an audio device according to the thirteenth embodiment. As shown in FIGS. 15 and 17, an audio device 1M according to the thirteenth embodiment is different from the audio device 1K in that the arrangement of piezoelectric vibrators P8 is different and is the same as the audio device 1K in other points. That is, the audio device 1M also includes a pair of piezoelectric vibrators P7 and a pair of piezoelectric vibrators P8 having different natural frequencies and can improve sound quality in a wide range while achieving downsizing.

In the audio device 1M, each piezoelectric vibrator P8 is disposed in such a way that the major-axis direction of the main face 11a is aligned with the first direction D1 and that the minor-axis direction of the main face 11a is aligned with the second direction D2. Each piezoelectric vibrator P8 is disposed to be separated from the long side portions 3c and the short side portions 3d. Each piezoelectric vibrator P8 is disposed near the gravity center G. When viewed from the third direction D3, the distance (shortest distance) between each piezoelectric vibrator P8 and the restraint member 2 is longer than the distance (shortest distance) between each piezoelectric vibrator P7 and the restraint member 2.

As described with reference to FIG. 9, as each piezoelectric vibrator P1 is closer to the gravity center G, the displacement decreases in a low range, and the followability is improved in a high range. Similarly, as each piezoelectric vibrator P8 is closer to the gravity center G, the displacement decreases in a low range, and the followability is improved in a high range. Thus, according to the audio device 1M, it is possible to further improve sound quality in a higher range than the audio device 1K does.

Fourteenth Embodiment

Figure 18:
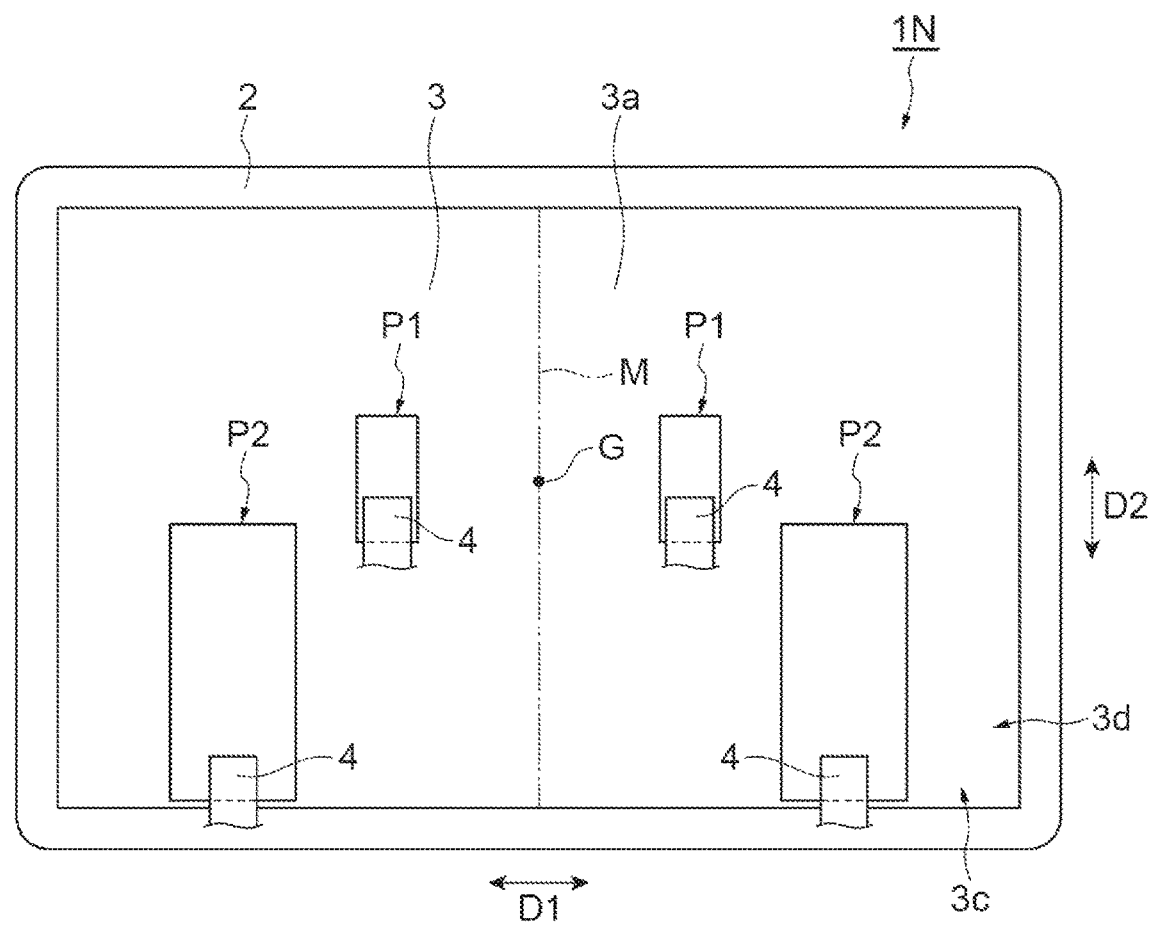
FIG. 18 is a plan view of an audio device according to a fourteenth embodiment.

FIG. 18 is a plan view of an audio device according to a fourteenth embodiment. As shown in FIGS. 8 and 18, an audio device 1N according to the fourteenth embodiment is different from the audio device 1E in that the arrangement of piezoelectric vibrators P1 and piezoelectric vibrators P2 is different and is the same as the audio device 1E in other points. That is, the audio device 1N also includes a pair of piezoelectric vibrators P1 and a pair of piezoelectric vibrators P2 having different natural frequencies and can improve sound quality in a wide range while achieving downsizing.

While each piezoelectric vibrator P1 is arranged to be separated farther from the straight line M than each piezoelectric vibrator P2 in the audio device 1E, each piezoelectric vibrator P1 is arranged closer to the straight line M than each piezoelectric vibrator P2 in the audio device 1N. Each piezoelectric vibrator P1 is disposed closer to the gravity center G than each piezoelectric vibrator P2. When viewed from the third direction D3, the distance (shortest distance) between each piezoelectric vibrator P1 and the gravity center G is shorter than the distance (shortest distance) between each piezoelectric vibrator P2 and the gravity center G. As described with reference to FIG. 9, as each piezoelectric vibrator P1 is closer to the gravity center G, the displacement decreases in a low range, and the followability is improved in a high range. Thus, in the audio device 1N, each piezoelectric vibrator P1 can reliably improve sound quality in a high range. Accordingly, the audio device 1N can reliably improve sound quality in a wide range.

The present invention is not necessarily limited to the above embodiments, and can be variously changed without departing from the gist.

For example, each of the piezoelectric vibrators P1 to P8 may be disposed not on the main face 3a but on the main face 3b.

REFERENCE SIGNS LIST 1A, 1B, 1C, 1D, 1E, 1F, 1G, 11H, 1I, 1J, 1K, 1L, 1M, 1N Audio device
2 Restraint member
3 Vibration member
3a Main face
P1, P2, P3, P4, P5, P6, P7, P8 Piezoelectric vibrator
G Gravity center.

The invention claimed is:

1. An audio device comprising:
a vibration member; and
a first piezoelectric vibrator and a second piezoelectric vibrator on the vibration member, wherein
a natural frequency of the first piezoelectric vibrator is larger than a natural frequency of the second piezoelectric vibrator,
the first piezoelectric vibrator is one of a pair of first piezoelectric vibrators,
the pair of first piezoelectric vibrators is on both sides of a straight line which passes through a gravity center of a main face of the vibration member when viewed from a direction orthogonal to the main face of the vibration member,
a distance between the first piezoelectric vibrator and the gravity center is shorter than a distance between the second piezoelectric vibrator and the gravity center,
the pair of first piezoelectric vibrators is spaced apart from the gravity center, and
the second piezoelectric vibrator is spaced apart from the gravity center.

2. The audio device according to claim 1, wherein a maximum length of the first piezoelectric vibrator is shorter than a maximum length of the second piezoelectric vibrator when viewed from a direction orthogonal to a main face of the vibration member.

3. The audio device according to claim 1, wherein the first piezoelectric vibrator and the second piezoelectric vibrator are synchronously driven by a same drive signal.

4. The audio device according to claim 1, wherein a distance between the first piezoelectric vibrator and the second piezoelectric vibrator is longer than a maximum length of the second piezoelectric vibrator when viewed from a direction orthogonal to a main face of the vibration member.

5. The audio device according to claim 1, wherein a distance between the first piezoelectric vibrator and the second piezoelectric vibrator is shorter than a maximum length of the second piezoelectric vibrator when viewed from a direction orthogonal to a main face of the vibration member.

6. The audio device according to claim 1, further comprising a restraint member restraining the vibration member, wherein
a distance between the first piezoelectric vibrator and the restraint member is longer than a distance between the second piezoelectric vibrator and the restraint member when viewed from a direction orthogonal to a main face of the vibration member.

7. The audio device according to claim 6, wherein a distance between the first piezoelectric vibrator and a gravity center of a main face of the vibration member is shorter than a distance between the second piezoelectric vibrator and the gravity center when viewed from a direction orthogonal to the main face.

8. The audio device according to claim 1, further comprising a third piezoelectric vibrator on the vibration member, wherein
a natural frequency of the third piezoelectric vibrator is smaller than the natural frequency of the first piezoelectric vibrator and larger than the natural frequency of the second piezoelectric vibrator.

9. The audio device according to claim 1, wherein
the pair of first piezoelectric vibrators is line-symmetric with respect to the straight line when viewed from the direction orthogonal to a main face of the vibration member.

10. The audio device according to claim 9, wherein the second piezoelectric vibrator is one of a pair of second piezoelectric vibrators,
the pair of second piezoelectric vibrators is line-symmetric with respect to the straight line when viewed from the direction.

11. The audio device according to claim 1, wherein the first piezoelectric vibrator includes a plurality of piezoelectric layers laminated in a direction orthogonal to a main face of the vibration member.

12. The audio device according to claim 1, wherein the first piezoelectric vibrator includes an element body and an external electrode,
the element body includes a first face and a second face opposing each other,
the first face is connected to the vibration member, and
the external electrode is on the second face.

13. The audio device according to claim 12, wherein the first piezoelectric vibrator further includes an internal electrode and a via conductor, and
the external electrode is electrically connected to the internal electrode through the via conductor.

14. The audio device according to claim 12, further comprising a wiring member connected to the external electrode, and
the wiring member is a flexible printed circuit board or a flexible flat cable.

15. The audio device according to claim 1, wherein the first piezoelectric vibrator has a rectangular shape having a pair of long sides and a pair of short sides when viewed from a direction orthogonal to a main face of the vibration member.

16. The audio device according to claim 1, wherein the first piezoelectric vibrator has a square shape when viewed from the direction orthogonal to the main face of the vibration member.

17. The audio device according to claim 1, wherein the first piezoelectric vibrator has an elliptical shape when viewed from the direction orthogonal to the main face of the vibration member.

18. The audio device according to claim 1, wherein the first piezoelectric vibrator has a circular shape when viewed from the direction orthogonal to the main face of the vibration member.

19. An audio device comprising:
a vibration member; and
a first piezoelectric vibrator and a second piezoelectric vibrator on the vibration member, wherein
a natural frequency of the first piezoelectric vibrator is larger than a natural frequency of the second piezoelectric vibrator,
the first piezoelectric vibrator and second piezoelectric vibrator are
on a main face of the vibration member,
on the same side of a line passing through a gravity center of the main face, and
spaced apart from each other.

* * * * *